(12) United States Patent
Simolon et al.

(10) Patent No.: US 9,848,134 B2
(45) Date of Patent: Dec. 19, 2017

(54) INFRARED IMAGER WITH INTEGRATED METAL LAYERS

(71) Applicant: FLIR Systems, Inc., Wilsonville, OR (US)

(72) Inventors: Brian Simolon, Santa Barbara, CA (US); Eric A. Kurth, Santa Barbara, CA (US); Steve Barskey, Wilsonville, OR (US); Mark Nussmeier, Goleta, CA (US); Nicholas Högasten, Santa Barbara, CA (US); Theodore R. Hoelter, Goleta, CA (US); Katrin Strandemar, Rimbo (SE); Pierre Boulanger, Goleta, CA (US); Barbara Sharp, Santa Barbara, CA (US)

(73) Assignee: FLIR Systems, Inc., Wilsonville, OR (US)

( * ) Notice: Subject to any disclaimer, the term of this patent is extended or adjusted under 35 U.S.C. 154(b) by 1036 days.

(21) Appl. No.: 14/092,794

(22) Filed: Nov. 27, 2013

(65) Prior Publication Data

US 2014/0092256 A1 Apr. 3, 2014

Related U.S. Application Data

(63) Continuation-in-part of application No. 13/437,645, filed on Apr. 2, 2012, now Pat. No. 9,171,361, which (Continued)

(51) Int. Cl.
*H04N 9/10* (2006.01)
*H04N 9/14* (2006.01)
(Continued)

(52) U.S. Cl.
CPC ........... *H04N 5/33* (2013.01); *H01L 27/1469* (2013.01); *H04N 5/359* (2013.01); *H04N 5/365* (2013.01)

(58) Field of Classification Search
CPC .................................. H04N 5/33; H04N 5/332
See application file for complete search history.

(56) References Cited

U.S. PATENT DOCUMENTS

| 2,764,055 A | 9/1956 | Clemens et al. |
| 4,661,986 A | 4/1987 | Adelson |

(Continued)

FOREIGN PATENT DOCUMENTS

| CA | 2764055 | 7/2012 |
| CN | 2874947 | 2/2007 |

(Continued)

OTHER PUBLICATIONS

DARPA, "Broad Agency Announcement Low Cost Thermal Imager Manufacturing (LCTI-M)", Microsystems Technology Office, DARPA-BAA-11-27, Jan. 24, 2011. pp. 1-42, Arlington, VA.

(Continued)

*Primary Examiner* — Chikaodili E Anyikire
(74) *Attorney, Agent, or Firm* — Haynes and Boone, LLP

(57) ABSTRACT

Various techniques are provided for implementing, operating, and manufacturing infrared imaging devices using integrated circuits. In one example, a system includes a focal plane array (FPA) integrated circuit comprising an array of infrared sensors adapted to image a scene, a plurality of active circuit components, a first metal layer disposed above and connected to the circuit components, a second metal layer disposed above the first metal layer and connected to the first metal layer, and a third metal layer disposed above the second metal layer and below the infrared sensors. The third metal layer is connected to the second metal layer and the infrared sensors. The first, second, and third metal layers are the only metal layers of the FPA between the infrared sensors and the circuit components. The first, second, and (Continued)

third metal layers are adapted to route signals between the circuit components and the infrared sensors.

20 Claims, 14 Drawing Sheets

Related U.S. Application Data is a continuation-in-part of application No. 13/105,765, filed on May 11, 2011, now Pat. No. 8,565,547, and a continuation-in-part of application No. 12/766,739, filed on Apr. 23, 2010, now Pat. No. 8,520,970, said application No. 13/105,765 is a continuation of application No. PCT/EP2011/056432, filed on Apr. 21, 2011, and a continuation-in-part of application No. 12/766,739, filed on Apr. 23, 2010, now Pat. No. 8,520,970, said application No. PCT/EP2011/056432 is a continuation-in-part of application No. 12/766,739, filed on Apr. 23, 2010, now Pat. No. 8,520,970, application No. 14/092,794, which is a continuation-in-part of application No. PCT/US2012/041744, filed on Jun. 8, 2012, application No. 14/092,794, which is a continuation-in-part of application No. PCT/US2012/041749, filed on Jun. 8, 2012, application No. 14/092,794, which is a continuation-in-part of application No. PCT/US2012/041739, filed on Jun. 8, 2012.

(60) Provisional application No. 61/730,435, filed on Nov. 27, 2012, provisional application No. 61/748,018, filed on Dec. 31, 2012, provisional application No. 61/473,207, filed on Apr. 8, 2011, provisional application No. 61/656,889, filed on Jun. 7, 2012, provisional application No. 61/545,056, filed on Oct. 7, 2011, provisional application No. 61/495,873, filed on Jun. 10, 2011, provisional application No. 61/495,879, filed on Jun. 10, 2011, provisional application No. 61/495,888, filed on Jun. 10, 2011.

(51) Int. Cl.
*H04N 5/33* (2006.01)
*H04N 5/359* (2011.01)
*H01L 27/146* (2006.01)
*H04N 5/365* (2011.01)

(56) References Cited

U.S. PATENT DOCUMENTS

| | | | |
|---|---|---|---|
| 5,021,663 A * | 6/1991 | Hornbeck | G01J 5/02 |
| | | | 250/338.1 |
| 5,140,416 A | 8/1992 | Tinkler | |
| 5,420,419 A * | 5/1995 | Wood | G01J 5/061 |
| | | | 250/332 |
| 5,488,674 A | 1/1996 | Burt et al. | |
| 6,348,951 B1 | 2/2002 | Kim | |
| 6,396,543 B1 | 5/2002 | Shin et al. | |
| 6,424,843 B1 | 7/2002 | Reitmaa et al. | |
| 6,515,285 B1 * | 2/2003 | Marshall | G01J 5/20 |
| | | | 250/339.03 |
| 6,633,231 B1 | 10/2003 | Okamoto et al. | |
| 6,681,120 B1 | 1/2004 | Kim | |
| 6,759,949 B2 | 7/2004 | Miyahara | |
| 6,883,054 B2 | 4/2005 | Yamaguchi et al. | |
| 6,911,652 B2 | 6/2005 | Walkenstein | |
| 7,050,107 B1 | 5/2006 | Frank et al. | |
| D524,785 S | 7/2006 | Huang | |
| 7,084,857 B2 | 8/2006 | Lieberman et al. | |
| 7,208,733 B2 | 4/2007 | Mian et al. | |
| 7,263,379 B1 | 8/2007 | Parkulo et al. | |
| 7,284,921 B2 | 10/2007 | Lapstun et al. | |
| 7,296,747 B2 | 11/2007 | Rohs | |
| 7,305,368 B2 | 12/2007 | Lieberman et al. | |
| 7,321,783 B2 | 1/2008 | Kim | |
| 7,333,832 B2 | 2/2008 | Tsai et al. | |
| 7,377,835 B2 | 5/2008 | Parkulo et al. | |
| 7,420,663 B2 | 9/2008 | Wang et al. | |
| 7,453,064 B2 | 11/2008 | Lee | |
| 7,477,309 B2 | 1/2009 | Cuccias | |
| 7,567,818 B2 | 7/2009 | Pylkko | |
| 7,572,077 B2 | 8/2009 | Lapstun et al. | |
| 7,575,077 B2 | 8/2009 | Priepke et al. | |
| 7,595,904 B2 | 9/2009 | Lapstun et al. | |
| 7,620,265 B1 | 11/2009 | Wolff et al. | |
| 7,627,364 B2 | 12/2009 | Sato | |
| 7,697,962 B2 | 4/2010 | Cradick et al. | |
| 7,723,686 B2 | 5/2010 | Hannebauer | |
| 7,725,141 B2 | 5/2010 | Su | |
| 7,728,281 B2 | 6/2010 | Chen | |
| 7,735,974 B2 | 6/2010 | Silverbrook et al. | |
| 7,747,454 B2 | 6/2010 | Bartfeld et al. | |
| 7,760,919 B2 | 7/2010 | Namgoong | |
| 7,761,114 B2 | 7/2010 | Silverbrook et al. | |
| 7,773,870 B2 | 8/2010 | Naruse | |
| 7,801,733 B2 | 9/2010 | Lee et al. | |
| 7,810,733 B2 | 10/2010 | Silverbrook et al. | |
| 7,872,574 B2 | 1/2011 | Betts et al. | |
| 7,876,973 B2 | 1/2011 | Fairbanks et al. | |
| 7,900,842 B2 | 3/2011 | Silverbrook et al. | |
| 7,903,152 B2 | 3/2011 | Kim | |
| 7,947,222 B2 | 5/2011 | Bae et al. | |
| 7,960,700 B2 | 6/2011 | Craig et al. | |
| 8,153,980 B1 * | 4/2012 | Brady | G01J 3/0232 |
| | | | 250/338.1 |
| 8,275,413 B1 | 9/2012 | Fraden et al. | |
| 8,305,577 B2 | 11/2012 | Kivioja et al. | |
| 8,345,226 B2 | 1/2013 | Zhang | |
| 8,537,343 B2 | 9/2013 | Zhang | |
| 8,781,420 B2 * | 7/2014 | Schlub | H01Q 1/243 |
| | | | 455/115.1 |
| 8,825,112 B1 * | 9/2014 | Fraden | G01J 5/0265 |
| | | | 455/344 |
| 2002/0006337 A1 | 1/2002 | Kimura et al. | |
| 2002/0058352 A1 | 5/2002 | Jacksen et al. | |
| 2002/0122036 A1 | 9/2002 | Sasaki | |
| 2002/0135571 A1 | 9/2002 | Klocek et al. | |
| 2002/0140542 A1 | 10/2002 | Prokoski et al. | |
| 2002/0149600 A1 | 10/2002 | Van Splunter et al. | |
| 2003/0007193 A1 | 1/2003 | Sato et al. | |
| 2003/0112871 A1 | 6/2003 | Demos | |
| 2003/0122957 A1 | 7/2003 | Emme | |
| 2003/0223623 A1 | 12/2003 | Gutta et al. | |
| 2004/0047518 A1 | 3/2004 | Tiana | |
| 2004/0101298 A1 | 5/2004 | Mandelbaum et al. | |
| 2004/0127156 A1 | 7/2004 | Park | |
| 2004/0128070 A1 | 7/2004 | Schmidt et al. | |
| 2004/0157612 A1 | 8/2004 | Kim | |
| 2004/0165788 A1 | 8/2004 | Perez et al. | |
| 2004/0169860 A1 | 9/2004 | Jung et al. | |
| 2004/0207036 A1 | 10/2004 | Ikeda | |
| 2004/0256561 A1 | 12/2004 | Beuhler et al. | |
| 2005/0030314 A1 | 2/2005 | Dawson | |
| 2005/0067852 A1 | 3/2005 | Jeong | |
| 2005/0089241 A1 | 4/2005 | Kawanishi et al. | |
| 2005/0068333 A1 | 5/2005 | Nakahashi et al. | |
| 2005/0093890 A1 | 5/2005 | Baudisch | |
| 2005/0110803 A1 | 5/2005 | Sugimura | |
| 2005/0138569 A1 | 6/2005 | Baxter et al. | |
| 2005/0169655 A1 | 8/2005 | Koyama et al. | |
| 2005/0184993 A1 | 8/2005 | Ludwin et al. | |
| 2005/0213813 A1 | 9/2005 | Lin et al. | |
| 2005/0213853 A1 | 9/2005 | Maier et al. | |
| 2005/0219249 A1 | 10/2005 | Xie et al. | |
| 2005/0248912 A1 | 11/2005 | Kang et al. | |
| 2005/0265688 A1 | 12/2005 | Kobayashi | |
| 2005/0270784 A1 | 12/2005 | Hahn et al. | |
| 2005/0277447 A1 | 12/2005 | Buil et al. | |
| 2006/0039686 A1 | 2/2006 | Soh et al. | |

(56) References Cited

U.S. PATENT DOCUMENTS

| | | |
|---|---|---|
| 2006/0060984 A1 | 3/2006 | Wakabayashi et al. |
| 2006/0077246 A1 | 4/2006 | Kawakami et al. |
| 2006/0097172 A1 | 5/2006 | Park |
| 2006/0120712 A1 | 6/2006 | Kim |
| 2006/0132642 A1 | 6/2006 | Hosaka et al. |
| 2006/0140501 A1 | 6/2006 | Tadas |
| 2006/0147191 A1 | 7/2006 | Kim |
| 2006/0154559 A1 | 7/2006 | Yoshida |
| 2006/0210249 A1 | 9/2006 | Seto |
| 2006/0234744 A1 | 10/2006 | Sung et al. |
| 2006/0240867 A1 | 10/2006 | Wang et al. |
| 2006/0279758 A1 | 12/2006 | Myoki |
| 2006/0285907 A1 | 12/2006 | Kang et al. |
| 2007/0004449 A1 | 1/2007 | Sham |
| 2007/0019077 A1 | 1/2007 | Park |
| 2007/0019099 A1 | 1/2007 | Lieberman et al. |
| 2007/0019103 A1 | 1/2007 | Lieberman et al. |
| 2007/0033309 A1 | 2/2007 | Kuwabara et al. |
| 2007/0034800 A1 | 2/2007 | Huang |
| 2007/0052616 A1 | 3/2007 | Yoon |
| 2007/0057764 A1 | 3/2007 | Sato et al. |
| 2007/0103479 A1 | 5/2007 | Kim et al. |
| 2007/0120058 A1 | 5/2007 | Blackwell et al. |
| 2007/0120879 A1 | 5/2007 | Kanade et al. |
| 2007/0132858 A1 | 6/2007 | Chiba et al. |
| 2007/0139739 A1 | 6/2007 | Kim et al. |
| 2007/0159524 A1 | 7/2007 | Kim et al. |
| 2007/0170363 A1* | 7/2007 | Schimert ............... G01J 5/02 250/353 |
| 2007/0189583 A1 | 8/2007 | Shimada et al. |
| 2007/0211965 A1 | 9/2007 | Helbing et al. |
| 2007/0222798 A1 | 9/2007 | Kuno |
| 2007/0248284 A1 | 10/2007 | Bernsen et al. |
| 2007/0274541 A1 | 11/2007 | Uetake et al. |
| 2007/0285439 A1 | 12/2007 | King et al. |
| 2007/0286517 A1 | 12/2007 | Palk et al. |
| 2007/0299226 A1 | 12/2007 | Park et al. |
| 2008/0038579 A1 | 2/2008 | Schuisky et al. |
| 2008/0056612 A1 | 3/2008 | Park et al. |
| 2008/0079834 A1 | 4/2008 | Chung et al. |
| 2008/0112012 A1 | 5/2008 | Yokoyama et al. |
| 2008/0151056 A1 | 6/2008 | Ahamefula |
| 2008/0165190 A1 | 7/2008 | Min et al. |
| 2008/0165342 A1 | 7/2008 | Yoshida et al. |
| 2008/0170082 A1 | 7/2008 | Kim |
| 2008/0218474 A1 | 9/2008 | Ahn et al. |
| 2008/0248833 A1 | 10/2008 | Silverbrook et al. |
| 2008/0266079 A1 | 10/2008 | Lontka |
| 2008/0278772 A1 | 11/2008 | Silverbrook et al. |
| 2008/0284880 A1 | 11/2008 | Numata |
| 2008/0292144 A1 | 11/2008 | Kim |
| 2008/0297614 A1 | 12/2008 | Lieberman et al. |
| 2009/0023421 A1 | 1/2009 | Parkulo et al. |
| 2009/0027525 A1 | 1/2009 | Lin et al. |
| 2009/0040042 A1 | 2/2009 | Lontka |
| 2009/0040195 A1 | 2/2009 | Njolstad et al. |
| 2009/0052883 A1 | 2/2009 | Lee et al. |
| 2009/0129700 A1 | 5/2009 | Rother et al. |
| 2009/0131104 A1 | 5/2009 | Yoon |
| 2009/0148019 A1 | 6/2009 | Hamada et al. |
| 2009/0213110 A1 | 8/2009 | Kato et al. |
| 2009/0215479 A1 | 8/2009 | Karmarkar |
| 2009/0227287 A1 | 9/2009 | Kotidis |
| 2009/0238238 A1 | 9/2009 | Hollander et al. |
| 2009/0278048 A1 | 11/2009 | Choe et al. |
| 2009/0297062 A1 | 12/2009 | Moine et al. |
| 2009/0303363 A1 | 12/2009 | Blessinger |
| 2010/0066866 A1 | 3/2010 | Lim |
| 2010/0090965 A1 | 4/2010 | Birkler |
| 2010/0090983 A1 | 4/2010 | Challener et al. |
| 2010/0103141 A1 | 4/2010 | Challener et al. |
| 2010/0113068 A1 | 5/2010 | Rothschild |
| 2010/0131268 A1 | 5/2010 | Moeller |
| 2010/0144387 A1 | 6/2010 | Chou |
| 2010/0163730 A1 | 7/2010 | Schmidt et al. |
| 2010/0234067 A1 | 9/2010 | Silverbrook et al. |
| 2010/0245582 A1 | 9/2010 | Harel |
| 2010/0245585 A1 | 9/2010 | Fisher et al. |
| 2010/0245826 A1 | 9/2010 | Lee |
| 2010/0314543 A1 | 12/2010 | Lee et al. |
| 2011/0043486 A1 | 2/2011 | Hagiwara et al. |
| 2011/0063446 A1 | 3/2011 | McMordie et al. |
| 2011/0102599 A1 | 5/2011 | Kwon et al. |
| 2011/0117532 A1 | 5/2011 | Relyea et al. |
| 2011/0121978 A1 | 5/2011 | Schwörer et al. |
| 2011/0122075 A1 | 5/2011 | Seo et al. |
| 2011/0128384 A1 | 6/2011 | Tiscareno et al. |
| 2012/0007987 A1 | 1/2012 | Gaber |
| 2012/0083314 A1 | 4/2012 | Ng et al. |
| 2012/0161003 A1* | 6/2012 | Tsuchiya ............... G01J 5/0225 250/338.3 |
| 2012/0184252 A1 | 7/2012 | Hirsch |
| 2012/0273688 A1 | 11/2012 | Tsai et al. |
| 2012/0274814 A1 | 11/2012 | Wajs |
| 2012/0276954 A1 | 11/2012 | Kowalsky |
| 2012/0292518 A1 | 11/2012 | Goldstein |
| 2012/0320086 A1 | 12/2012 | Kasama et al. |
| 2013/0204570 A1 | 8/2013 | Mendelson et al. |
| 2013/0320220 A1 | 12/2013 | Donowsky |
| 2014/0092256 A1* | 4/2014 | Simolon ................... H04N 5/33 348/164 |

FOREIGN PATENT DOCUMENTS

| | | |
|---|---|---|
| CN | 2899321 | 5/2007 |
| CN | 101226635 | 7/2008 |
| CN | 201203922 | 3/2009 |
| CN | 101404084 | 4/2009 |
| CN | 101635754 | 1/2010 |
| CN | 201481406 | 5/2010 |
| CN | 201550169 | 8/2010 |
| CN | 101859209 | 10/2010 |
| CN | 201628839 | 11/2010 |
| CN | 101945154 | 1/2011 |
| CN | 102045423 | 5/2011 |
| CN | 102045448 | 5/2011 |
| CN | 102055836 | 5/2011 |
| CN | 201869255 | 6/2011 |
| CN | 201897853 | 7/2011 |
| CN | 102178510 | 9/2011 |
| CN | 202261481 | 5/2012 |
| CN | 102880289 | 1/2013 |
| CN | 202998279 | 6/2013 |
| DE | 102006057431 | 6/2008 |
| EP | 0 973 137 | 1/2000 |
| EP | 2477391 | 7/2012 |
| GB | 2442512 | 4/2008 |
| JP | 1997275518 | 4/1999 |
| JP | 2004048571 | 2/2004 |
| JP | 2004-241491 A | 8/2004 |
| JP | 2006098098 | 4/2006 |
| JP | 2006105655 | 4/2006 |
| JP | 2007006475 | 1/2007 |
| JP | 2007325842 | 12/2007 |
| JP | 2010181324 | 8/2010 |
| JP | 2012231309 | 11/2012 |
| KR | 20000026757 | 5/2000 |
| KR | 100227582 | 11/2000 |
| KR | 100272582 | 11/2000 |
| KR | 20000073381 | 12/2000 |
| KR | 100285817 | 1/2001 |
| KR | 20010001341 | 1/2001 |
| KR | 20110002462 | 1/2001 |
| KR | 20010010010 | 2/2001 |
| KR | 20010014992 | 2/2001 |
| KR | 20010044756 | 6/2001 |
| KR | 20010050263 | 6/2001 |
| KR | 20010060752 | 7/2001 |
| KR | 20010068202 | 7/2001 |
| KR | 20010070355 | 7/2001 |
| KR | 20010074565 | 8/2001 |
| KR | 20020006967 | 1/2002 |
| KR | 20020044339 | 6/2002 |
| KR | 20020049605 | 6/2002 |

(56) References Cited

FOREIGN PATENT DOCUMENTS

| | | |
|---|---|---|
| KR | 20060071220 | 6/2002 |
| KR | 20020061406 | 7/2002 |
| KR | 20020061920 | 7/2002 |
| KR | 20020069690 | 9/2002 |
| KR | 20020078469 | 10/2002 |
| KR | 20020083368 | 11/2002 |
| KR | 20020083961 | 11/2002 |
| KR | 20020085124 | 11/2002 |
| KR | 20020085490 | 11/2002 |
| KR | 20020095752 | 12/2002 |
| KR | 20030000332 | 1/2003 |
| KR | 20030007030 | 1/2003 |
| KR | 20030012444 | 2/2003 |
| KR | 20030016607 | 3/2003 |
| KR | 20030024545 | 3/2003 |
| KR | 20030037101 | 5/2003 |
| KR | 20030051140 | 6/2003 |
| KR | 20030055693 | 7/2003 |
| KR | 20030056667 | 7/2003 |
| KR | 20030067116 | 8/2003 |
| KR | 20030085742 | 11/2003 |
| KR | 20030088968 | 11/2003 |
| KR | 20040001684 | 1/2004 |
| KR | 20040001686 | 1/2004 |
| KR | 20040023826 | 3/2004 |
| KR | 20040027692 | 4/2004 |
| KR | 20040033223 | 4/2004 |
| KR | 20040033532 | 4/2004 |
| KR | 20040033986 | 4/2004 |
| KR | 20040033993 | 4/2004 |
| KR | 20040039868 | 5/2004 |
| KR | 20040040296 | 5/2004 |
| KR | 20040042475 | 5/2004 |
| KR | 20040044624 | 5/2004 |
| KR | 100437890 | 6/2004 |
| KR | 20040054416 | 6/2004 |
| KR | 20040058969 | 7/2004 |
| KR | 20040062802 | 7/2004 |
| KR | 20040064855 | 7/2004 |
| KR | 20040066724 | 7/2004 |
| KR | 20040068864 | 8/2004 |
| KR | 20040070840 | 8/2004 |
| KR | 20040076308 | 9/2004 |
| KR | 20040086994 | 10/2004 |
| KR | 20040102386 | 12/2004 |
| KR | 20050008245 | 1/2005 |
| KR | 20050011313 | 1/2005 |
| KR | 20050012505 | 2/2005 |
| KR | 20050014448 | 2/2005 |
| KR | 20050015293 | 2/2005 |
| KR | 20050015526 | 2/2005 |
| KR | 20050015745 | 2/2005 |
| KR | 20050018370 | 2/2005 |
| KR | 20050023950 | 3/2005 |
| KR | 20050028537 | 3/2005 |
| KR | 20050033308 | 4/2005 |
| KR | 101006660 | 9/2005 |
| KR | 1020050095463 | 9/2005 |
| KR | 100547739 | 1/2006 |
| KR | 20060023957 | 3/2006 |
| KR | 1020060019715 | 3/2006 |
| KR | 100645746 | 5/2006 |
| KR | 20060054877 | 5/2006 |
| KR | 100612890 | 8/2006 |
| KR | 100633792 | 10/2006 |
| KR | 100646966 | 11/2006 |
| KR | 20060119077 | 11/2006 |
| KR | 20060119236 | 11/2006 |
| KR | 20060120318 | 11/2006 |
| KR | 20060121595 | 11/2006 |
| KR | 100660125 | 12/2006 |
| KR | 100663528 | 1/2007 |
| KR | 100672377 | 1/2007 |
| KR | 20070002590 | 1/2007 |
| KR | 20070005263 | 1/2007 |
| KR | 20070005553 | 1/2007 |
| KR | 20070009380 | 1/2007 |
| KR | 100677913 | 2/2007 |
| KR | 100689465 | 3/2007 |
| KR | 20070028201 | 3/2007 |
| KR | 100722974 | 5/2007 |
| KR | 100729813 | 6/2007 |
| KR | 20070067650 | 6/2007 |
| KR | 100743171 | 7/2007 |
| KR | 100743254 | 7/2007 |
| KR | 20070068501 | 7/2007 |
| KR | 20070078477 | 8/2007 |
| KR | 20070082960 | 8/2007 |
| KR | 20070087513 | 8/2007 |
| KR | 20070091486 | 9/2007 |
| KR | 100766953 | 10/2007 |
| KR | 100771364 | 10/2007 |
| KR | 20070104957 | 10/2007 |
| KR | 100777428 | 11/2007 |
| KR | 20070115754 | 12/2007 |
| KR | 20070122344 | 12/2007 |
| KR | 20070122345 | 12/2007 |
| KR | 100802525 | 2/2008 |
| KR | 20080013314 | 2/2008 |
| KR | 20080015099 | 2/2008 |
| KR | 20080015100 | 2/2008 |
| KR | 20080015973 | 2/2008 |
| KR | 20080018407 | 2/2008 |
| KR | 100822053 | 4/2008 |
| KR | 20080045551 | 5/2008 |
| KR | 100841243 | 6/2008 |
| KR | 20080053057 | 6/2008 |
| KR | 20080054596 | 6/2008 |
| KR | 100846192 | 7/2008 |
| KR | 20080059882 | 7/2008 |
| KR | 20080069007 | 7/2008 |
| KR | 100854932 | 8/2008 |
| KR | 20080071070 | 8/2008 |
| KR | 20080078315 | 8/2008 |
| KR | 100866177 | 10/2008 |
| KR | 100866475 | 11/2008 |
| KR | 100866476 | 11/2008 |
| KR | 100866573 | 11/2008 |
| KR | 100870724 | 11/2008 |
| KR | 20080096918 | 11/2008 |
| KR | 20080098409 | 11/2008 |
| KR | 100871916 | 12/2008 |
| KR | 20080112331 | 12/2008 |
| KR | 20090003899 | 1/2009 |
| KR | 20090018486 | 2/2009 |
| KR | 20090020864 | 2/2009 |
| KR | 100888554 | 3/2009 |
| KR | 20090036734 | 4/2009 |
| KR | 100897170 | 5/2009 |
| KR | 20090052526 | 5/2009 |
| KR | 100901784 | 6/2009 |
| KR | 100903348 | 6/2009 |
| KR | 20090089931 | 8/2009 |
| KR | 100922497 | 10/2009 |
| KR | 20090105424 | 10/2009 |
| KR | 100932752 | 12/2009 |
| KR | 100935495 | 1/2010 |
| KR | 20100006652 | 1/2010 |
| KR | 2010022327 | 3/2010 |
| KR | 20100039170 | 4/2010 |
| KR | 100958030 | 5/2010 |
| KR | 20100059681 | 6/2010 |
| KR | 20100070116 | 6/2010 |
| KR | 20100070119 | 6/2010 |
| KR | 20100072994 | 7/2010 |
| KR | 100977516 | 8/2010 |
| KR | 2010091758 | 8/2010 |
| KR | 20100089125 | 8/2010 |
| KR | 20100090521 | 8/2010 |
| KR | 20100091758 | 8/2010 |
| KR | 20100098958 | 9/2010 |
| KR | 100985816 | 10/2010 |
| KR | 100990904 | 11/2010 |
| KR | 20100123021 | 11/2010 |

(56) References Cited

FOREIGN PATENT DOCUMENTS

| | | |
|---|---|---|
| KR | 1006660 | 1/2011 |
| KR | 20110006437 | 1/2011 |
| KR | 20110011264 | 2/2011 |
| KR | 2011019994 | 3/2011 |
| KR | 2011024290 | 3/2011 |
| KR | 101111167 | 4/2011 |
| KR | 1111167 | 2/2012 |
| KR | 1020130142810 | 12/2013 |
| TW | 201116030 | 5/2011 |
| WO | WO 98/35212 | 8/1998 |
| WO | WO 00/23814 | 4/2000 |
| WO | WO 03/093963 | 11/2003 |
| WO | WO 2005/002228 | 1/2005 |
| WO | WO 2005/088846 | 9/2005 |
| WO | WO 2006/112866 | 10/2006 |
| WO | WO 2007/006242 | 1/2007 |
| WO | WO 2009/122114 | 10/2009 |
| WO | WO 2010/005152 | 1/2010 |
| WO | WO 2010/033142 | 3/2010 |

OTHER PUBLICATIONS

Ager, Thomas P., et al., "Geo-positional Accuracy Evaluation of QuickBird Ortho-Ready Standard 2A Multispectral Imagery," Algorithms and Technologies for Multispectral, Hyperspectral, and Ultraspectral Imagery X, vol. 5425, Aug. 12, 2004, pp. 488-499.
Gangkofner, Ute G., et al., "Optimizing the High-Pass Filter Addition Technique for Image Fusion," Photogrammetric Engineering & Remote Sensing, vol. 74, No. 9, Sep. 1, 2008, pp. 1107-1118.
Hao et al., "An Infrared Image Fusion Algorithm Based on Lifting Wavelet Transform", Laser & Infrared, Jan. 31, 2009, vol. 39, No. 1, pp. 97-100.
Yan Jixiang, "Infrared Image Sequence Enhancement Based on Wavelet Transform", Full-Text Database of China Excellent Master Degree Thesis, Information Technology Collection, Jan. 15, 2009, No. 01, 69 pages.
Kryskowski et al., "80×60 element thermoelectric infrared focal plane array for high-volume commercial use", Infrared Technology and Applications XXXV, Proc. of SPIE vol. 7298, 72980N, © 2009, 12 pages.

\* cited by examiner

INFRARED IMAGER WITH INTEGRATED METAL LAYERS

CROSS-REFERENCE TO RELATED APPLICATIONS

This application claims the benefit of U.S. Provisional Patent Application No. 61/730,435 filed Nov. 27, 2012, entitled "INFRARED IMAGER WITH INTEGRATED METAL LAYERS" which is hereby incorporated by reference in its entirety.

This application claims the benefit of U.S. Provisional Patent Application No. 61/748,018 filed Dec. 31, 2012 and entitled "COMPACT MULTI-SPECTRUM IMAGING WITH FUSION" which is hereby incorporated by reference in its entirety.

This patent application is a continuation-in-part of U.S. patent application Ser. No. 13/437,645 filed Apr. 2, 2012 and entitled "INFRARED RESOLUTION AND CONTRAST ENHANCEMENT WITH FUSION" which is hereby incorporated by reference in its entirety.

U.S. patent application Ser. No. 13/437,645 is a continuation-in-part of U.S. patent application Ser. No. 13/105,765 filed May 11, 2011 and entitled "INFRARED RESOLUTION AND CONTRAST ENHANCEMENT WITH FUSION" which is hereby incorporated by reference in its entirety.

U.S. patent application Ser. No. 13/437,645 also claims the benefit of U.S. Provisional Patent Application No. 61/473,207 filed Apr. 8, 2011 and entitled "INFRARED RESOLUTION AND CONTRAST ENHANCEMENT WITH FUSION" which is hereby incorporated by reference in its entirety.

U.S. patent application Ser. No. 13/437,645 is also a continuation-in-part of U.S. patent application Ser. No. 12/766,739 filed Apr. 23, 2010 and entitled "INFRARED RESOLUTION AND CONTRAST ENHANCEMENT WITH FUSION" which is hereby incorporated by reference in its entirety.

U.S. patent application Ser. No. 13/105,765 is a continuation of International Patent Application No. PCT/EP2011/056432 filed Apr. 21, 2011 and entitled "INFRARED RESOLUTION AND CONTRAST ENHANCEMENT WITH FUSION" which is hereby incorporated by reference in its entirety.

U.S. patent application Ser. No. 13/105,765 is also a continuation-in-part of U.S. patent application Ser. No. 12/766,739 filed Apr. 23, 2010 and entitled "INFRARED RESOLUTION AND CONTRAST ENHANCEMENT WITH FUSION" which is hereby incorporated by reference in its entirety.

International Patent Application No. PCT/EP2011/056432 is a continuation-in-part of U.S. patent application Ser. No. 12/766,739 filed Apr. 23, 2010 and entitled "INFRARED RESOLUTION AND CONTRAST ENHANCEMENT WITH FUSION" which is hereby incorporated by reference in its entirety.

International Patent Application No. PCT/EP2011/056432 also claims the benefit of U.S. Provisional Patent Application No. 61/473,207 filed Apr. 8, 2011 and entitled "INFRARED RESOLUTION AND CONTRAST ENHANCEMENT WITH FUSION" which is hereby incorporated by reference in its entirety.

This application is a continuation-in-part of International Patent Application No. PCT/US2012/041744 filed Jun. 8, 2012 and entitled "LOW POWER AND SMALL FORM FACTOR INFRARED IMAGING" which is hereby incorporated by reference in its entirety.

International Patent Application No. PCT/US2012/041744 claims the benefit of U.S. Provisional Patent Application No. 61/656,889 filed Jun. 7, 2012 and entitled "LOW POWER AND SMALL FORM FACTOR INFRARED IMAGING" which is hereby incorporated by reference in its entirety.

International Patent Application No. PCT/US2012/041744 claims the benefit of U.S. Provisional Patent Application No. 61/545,056 filed Oct. 7, 2011 and entitled "NON-UNIFORMITY CORRECTION TECHNIQUES FOR INFRARED IMAGING DEVICES" which is hereby incorporated by reference in its entirety.

International Patent Application No. PCT/US2012/041744 claims the benefit of U.S. Provisional Patent Application No. 61/495,873 filed Jun. 10, 2011 and entitled "INFRARED CAMERA PACKAGING SYSTEMS AND METHODS" which is hereby incorporated by reference in its entirety.

International Patent Application No. PCT/US2012/041744 claims the benefit of U.S. Provisional Patent Application No. 61/495,879 filed Jun. 10, 2011 and entitled "INFRARED CAMERA SYSTEM ARCHITECTURES" which is hereby incorporated by reference in its entirety.

International Patent Application No. PCT/US2012/041744 claims the benefit of U.S. Provisional Patent Application No. 61/495,888 filed Jun. 10, 2011 and entitled "INFRARED CAMERA CALIBRATION TECHNIQUES" which is hereby incorporated by reference in its entirety.

This application is a continuation-in-part of International Patent Application No. PCT/US2012/041749 filed Jun. 8, 2012 and entitled "NON-UNIFORMITY CORRECTION TECHNIQUES FOR INFRARED IMAGING DEVICES" which is hereby incorporated by reference in its entirety.

International Patent Application No. PCT/US2012/041749 claims the benefit of U.S. Provisional Patent Application No. 61/545,056 filed Oct. 7, 2011 and entitled "NON-UNIFORMITY CORRECTION TECHNIQUES FOR INFRARED IMAGING DEVICES" which is hereby incorporated by reference in its entirety.

International Patent Application No. PCT/US2012/041749 claims the benefit of U.S. Provisional Patent Application No. 61/495,873 filed Jun. 10, 2011 and entitled "INFRARED CAMERA PACKAGING SYSTEMS AND METHODS" which is hereby incorporated by reference in its entirety.

International Patent Application No. PCT/US2012/041749 claims the benefit of U.S. Provisional Patent Application No. 61/495,879 filed Jun. 10, 2011 and entitled "INFRARED CAMERA SYSTEM ARCHITECTURES" which is hereby incorporated by reference in its entirety.

International Patent Application No. PCT/US2012/041749 claims the benefit of U.S. Provisional Patent Application No. 61/495,888 filed Jun. 10, 2011 and entitled "INFRARED CAMERA CALIBRATION TECHNIQUES" which is hereby incorporated by reference in its entirety.

This application is a continuation-in-part of International Patent Application No. PCT/US2012/041739 filed Jun. 8, 2012 and entitled "INFRARED CAMERA SYSTEM ARCHITECTURES" which is hereby incorporated by reference in its entirety.

International Patent Application No. PCT/US2012/041739 claims the benefit of U.S. Provisional Patent Application No. 61/495,873 filed Jun. 10, 2011 and entitled "INFRARED CAMERA PACKAGING SYSTEMS AND METHODS" which is hereby incorporated by reference in its entirety.

International Patent Application No. PCT/US2012/041739 claims the benefit of U.S. Provisional Patent Application No. 61/495,879 filed Jun. 10, 2011 and entitled "INFRARED CAMERA SYSTEM ARCHITECTURES" which is hereby incorporated by reference in its entirety.

International Patent Application No. PCT/US2012/041739 claims the benefit of U.S. Provisional Patent Application No. 61/495,888 filed Jun. 10, 2011 and entitled "INFRARED CAMERA CALIBRATION TECHNIQUES" which is hereby incorporated by reference in its entirety.

TECHNICAL FIELD

One or more embodiments of the invention relate generally to thermal imaging devices and more particularly, for example, to integrated circuits used to implement such devices.

BACKGROUND

Infrared imaging devices, such as infrared cameras or other devices, are typically implemented with an array of infrared sensors. Such devices are often implemented as integrated circuits with interconnections provided between the infrared sensors and related circuitry. For example, such interconnections may be provided between the infrared sensors and various components of a read out integrated circuit (ROIC).

Many existing infrared imaging devices are implemented with relatively large arrays of infrared sensors. Unfortunately, as the number of infrared sensors increases, greater numbers of interconnected metal layers are typically required to provide signal paths between the infrared sensors and ROIC components. This complicates the design of integrated circuits and increases their associated manufacturing costs.

SUMMARY

Various techniques are provided for implementing, operating, and manufacturing infrared imaging devices using integrated circuits. In one embodiment, a system includes a focal plane array (FPA) integrated circuit comprising: an array of infrared sensors adapted to image a scene; a plurality of active circuit components; a first metal layer disposed above and connected to the circuit components; a second metal layer disposed above the first metal layer and connected to the first metal layer; a third metal layer disposed above the second metal layer and below the infrared sensors, wherein the third metal layer is connected to the second metal layer and the infrared sensors; wherein the first, second, and third metal layers are the only metal layers of the FPA between the infrared sensors and the circuit components; and wherein the first, second, and third metal layers are adapted to route signals between the circuit components and the infrared sensors.

In another embodiment, a method includes imaging a scene using a focal plane array (FPA) integrated circuit comprising: an array of infrared sensors adapted to image the scene, a plurality of active circuit components, a first metal layer disposed above and connected to the circuit components, a second metal layer disposed above the first metal layer and connected to the first metal layer, a third metal layer disposed above the second metal layer and below the infrared sensors, wherein the third metal layer is connected to the second metal layer and the infrared sensors, and wherein the first, second, and third metal layers are the only metal layers of the FPA between the infrared sensors and the circuit components; and routing signals between the circuit components and the infrared sensors through the first, second, and third metal layers.

In another embodiment, a method of manufacturing a focal plane array (FPA) integrated circuit includes forming a plurality of active circuit components; forming a plurality of insulating layers above the active circuit components; forming first, second, and third metal layers above the active circuit components; forming a plurality of infrared sensors above the metal layers and the insulating layers; wherein the circuit components, the first metal layer, the second metal layer, the third metal layer, and the infrared sensors are separated by corresponding ones of the insulating layers; wherein the first, second, and third metal layers are the only metal layers of the FPA between the infrared sensors and the circuit components; and wherein the first, second, and third metal layers are adapted to route signals between the circuit components and the infrared sensors.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Figure 1:
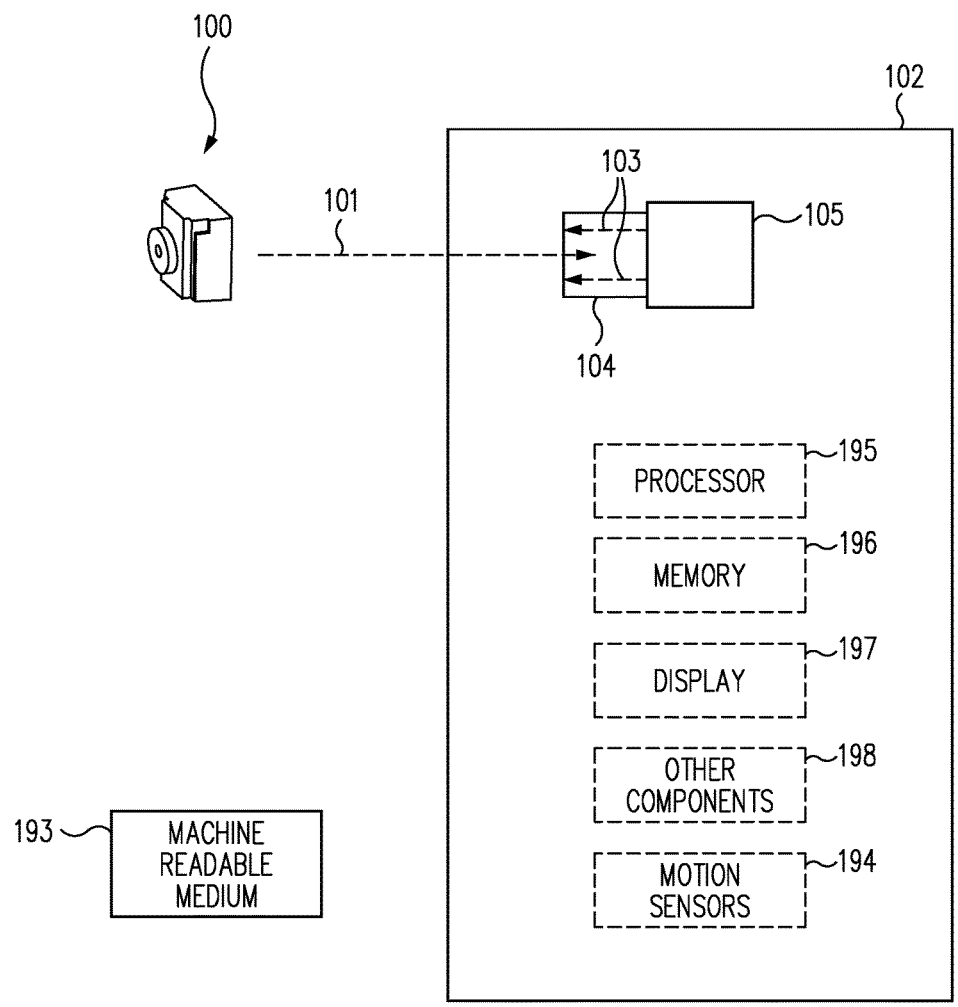
FIG. 1 illustrates an infrared imaging module configured to be implemented in a host device in accordance with an embodiment of the disclosure.

FIG. 1 illustrates an infrared imaging module 100 (e.g., an infrared camera or an infrared imaging device) configured to be implemented in a host device 102 in accordance with an embodiment of the disclosure. Infrared imaging module 100 may be implemented, for one or more embodiments, with a small form factor and in accordance with wafer level packaging techniques or other packaging techniques.

In one embodiment, infrared imaging module 100 may be configured to be implemented in a small portable host device 102, such as a mobile telephone, a tablet computing device, a laptop computing device, a personal digital assistant, a visible light camera, a music player, or any other appropriate mobile device. In this regard, infrared imaging module 100 may be used to provide infrared imaging features to host device 102. For example, infrared imaging module 100 may be configured to capture, process, and/or otherwise manage infrared images and provide such infrared images to host device 102 for use in any desired fashion (e.g., for further processing, to store in memory, to display, to use by various applications running on host device 102, to export to other devices, or other uses).

In various embodiments, infrared imaging module 100 may be configured to operate at low voltage levels and over a wide temperature range. For example, in one embodiment, infrared imaging module 100 may operate using a power supply of approximately 2.4 volts, 2.5 volts, 2.8 volts, or lower voltages, and operate over a temperature range of approximately −20 degrees C. to approximately +60 degrees C. (e.g., providing a suitable dynamic range and performance over an environmental temperature range of approximately 80 degrees C.). In one embodiment, by operating infrared imaging module 100 at low voltage levels, infrared imaging module 100 may experience reduced amounts of self heating in comparison with other types of infrared imaging devices. As a result, infrared imaging module 100 may be operated with reduced measures to compensate for such self heating.

Figure 2:
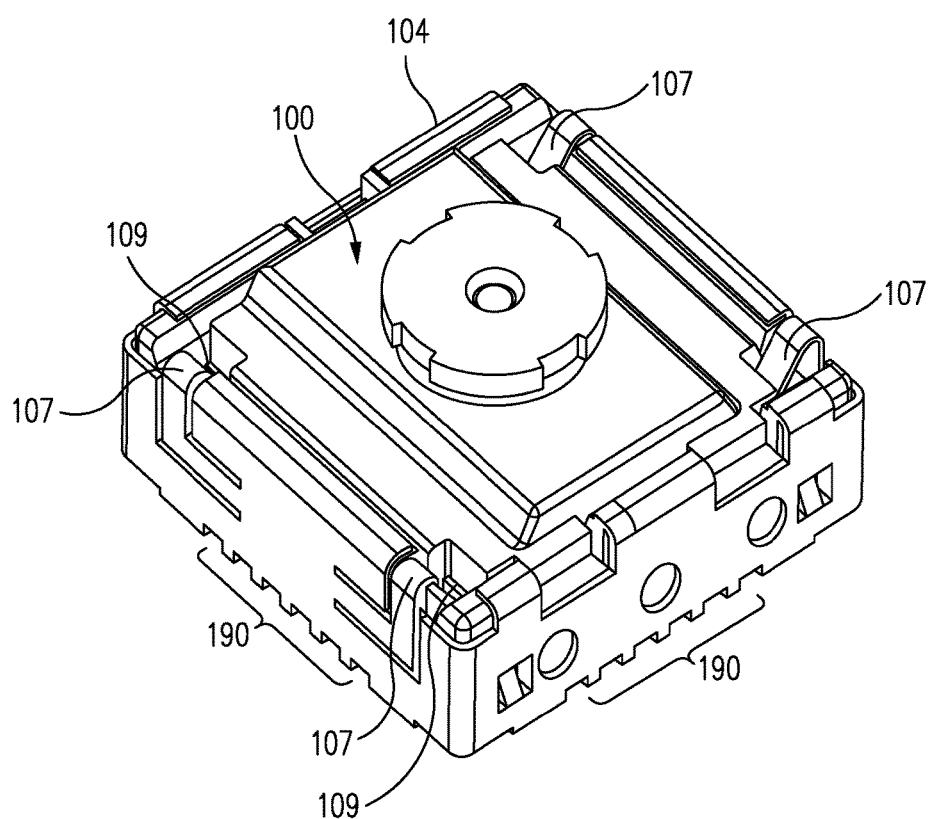
FIG. 2 illustrates an assembled infrared imaging module in accordance with an embodiment of the disclosure.

As shown in FIG. 1, host device 102 may include a socket 104, a shutter 105, motion sensors 194, a processor 195, a memory 196, a display 197, and/or other components 198. Socket 104 may be configured to receive infrared imaging module 100 as identified by arrow 101. In this regard, FIG. 2 illustrates infrared imaging module 100 assembled in socket 104 in accordance with an embodiment of the disclosure.

Motion sensors 194 may be implemented by one or more accelerometers, gyroscopes, or other appropriate devices that may be used to detect movement of host device 102. Motion sensors 194 may be monitored by and provide information to processing module 160 or processor 195 to detect motion. In various embodiments, motion sensors 194 may be implemented as part of host device 102 (as shown in FIG. 1), infrared imaging module 100, or other devices attached to or otherwise interfaced with host device 102.

Processor 195 may be implemented as any appropriate processing device (e.g., logic device, microcontroller, processor, application specific integrated circuit (ASIC), or other device) that may be used by host device 102 to execute appropriate instructions, such as software instructions provided in memory 196. Display 197 may be used to display captured and/or processed infrared images and/or other images, data, and information. Other components 198 may be used to implement any features of host device 102 as may be desired for various applications (e.g., clocks, temperature sensors, a visible light camera, or other components). In addition, a machine readable medium 193 may be provided for storing non-transitory instructions for loading into memory 196 and execution by processor 195.

In various embodiments, infrared imaging module 100 and socket 104 may be implemented for mass production to facilitate high volume applications, such as for implementation in mobile telephones or other devices (e.g., requiring small form factors). In one embodiment, the combination of infrared imaging module 100 and socket 104 may exhibit overall dimensions of approximately 8.5 mm by 8.5 mm by 5.9 mm while infrared imaging module 100 is installed in socket 104.

Figure 3:
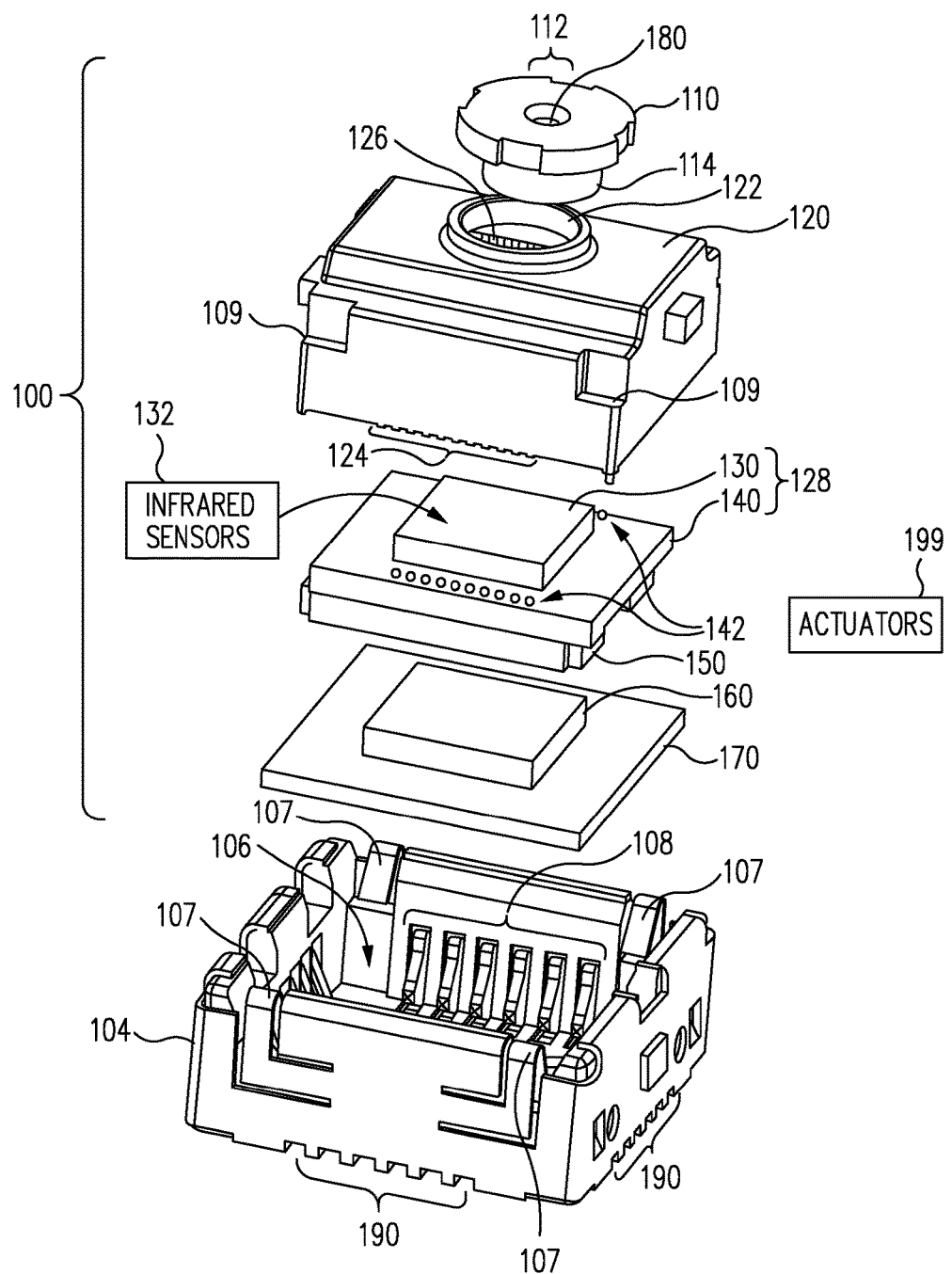
FIG. 3 illustrates an exploded view of an infrared imaging module juxtaposed over a socket in accordance with an embodiment of the disclosure.

FIG. 3 illustrates an exploded view of infrared imaging module 100 juxtaposed over socket 104 in accordance with an embodiment of the disclosure. Infrared imaging module 100 may include a lens barrel 110, a housing 120, an infrared sensor assembly 128, a circuit board 170, a base 150, and a processing module 160.

Lens barrel 110 may at least partially enclose an optical element 180 (e.g., a lens) which is partially visible in FIG. 3 through an aperture 112 in lens barrel 110. Lens barrel 110 may include a substantially cylindrical extension 114 which may be used to interface lens barrel 110 with an aperture 122 in housing 120.

Infrared sensor assembly 128 may be implemented, for example, with a cap 130 (e.g., a lid) mounted on a substrate 140. Infrared sensor assembly 128 may include a plurality of infrared sensors 132 (e.g., infrared detectors) implemented in an array or other fashion on substrate 140 and covered by cap 130. For example, in one embodiment, infrared sensor assembly 128 may be implemented as a focal plane array (FPA). Such a focal plane array may be implemented, for example, as a vacuum package assembly (e.g., sealed by cap 130 and substrate 140). In one embodiment, infrared sensor assembly 128 may be implemented as a wafer level package (e.g., infrared sensor assembly 128 may be singulated from a set of vacuum package assemblies provided on a wafer). In one embodiment, infrared sensor assembly 128 may be implemented to operate using a power supply of approximately 2.4 volts, 2.5 volts, 2.8 volts, or similar voltages.

Infrared sensors 132 may be configured to detect infrared radiation (e.g., infrared energy) from a target scene including, for example, mid wave infrared wave bands (MWIR), long wave infrared wave bands (LWIR), and/or other thermal imaging bands as may be desired in particular implementations. In one embodiment, infrared sensor assembly 128 may be provided in accordance with wafer level packaging techniques.

Infrared sensors 132 may be implemented, for example, as microbolometers or other types of thermal imaging infrared sensors arranged in any desired array pattern to provide a plurality of pixels. In one embodiment, infrared sensors 132 may be implemented as vanadium oxide (VOx) detectors with a 17 μm pixel pitch. In various embodiments, arrays of approximately 32 by 32 infrared sensors 132, approximately 64 by 64 infrared sensors 132, approximately 80 by 64 infrared sensors 132, or other array sizes may be used.

Substrate 140 may include various circuitry including, for example, a read out integrated circuit (ROIC) with dimensions less than approximately 5.5 mm by 5.5 mm in one embodiment. Substrate 140 may also include bond pads 142 that may be used to contact complementary connections positioned on inside surfaces of housing 120 when infrared imaging module 100 is assembled as shown in FIG. 3. In one embodiment, the ROIC may be implemented with low-dropout regulators (LDO) to perform voltage regulation to reduce power supply noise introduced to infrared sensor assembly 128 and thus provide an improved power supply rejection ratio (PSRR). Moreover, by implementing the LDO with the ROIC (e.g., within a wafer level package), less die area may be consumed and fewer discrete die (or chips) are needed.

Figure 4:
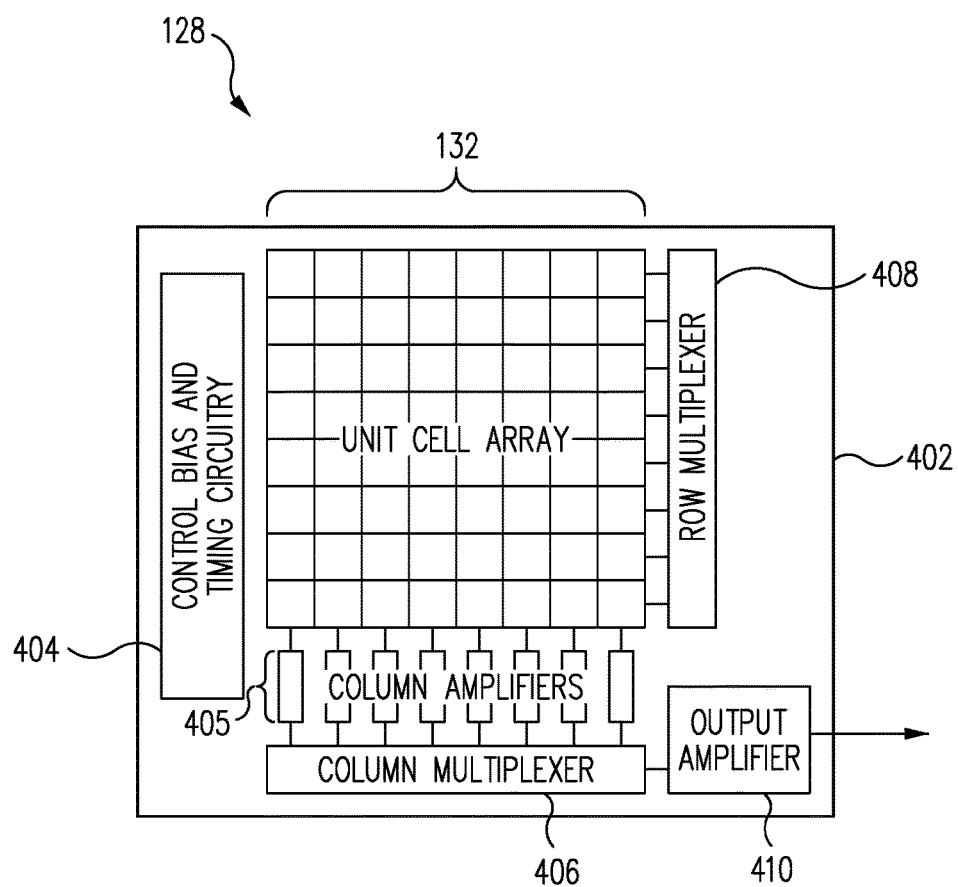
FIG. 4 illustrates a block diagram of an infrared sensor assembly including an array of infrared sensors in accordance with an embodiment of the disclosure.

FIG. 4 illustrates a block diagram of infrared sensor assembly 128 including an array of infrared sensors 132 in accordance with an embodiment of the disclosure. In the illustrated embodiment, infrared sensors 132 are provided as part of a unit cell array of a ROIC 402. ROIC 402 includes bias generation and timing control circuitry 404, column amplifiers 405, a column multiplexer 406, a row multiplexer 408, and an output amplifier 410. Image frames (e.g., thermal images) captured by infrared sensors 132 may be provided by output amplifier 410 to processing module 160, processor 195, and/or any other appropriate components to perform various processing techniques described herein. Although an 8 by 8 array is shown in FIG. 4, any desired array configuration may be used in other embodiments. Further descriptions of ROICs and infrared sensors (e.g., microbolometer circuits) may be found in U.S. Pat. No. 6,028,309 issued Feb. 22, 2000, which is incorporated herein by reference in its entirety.

Infrared sensor assembly 128 may capture images (e.g., image frames) and provide such images from its ROIC at various rates. Processing module 160 may be used to perform appropriate processing of captured infrared images and may be implemented in accordance with any appropriate architecture. In one embodiment, processing module 160 may be implemented as an ASIC. In this regard, such an ASIC may be configured to perform image processing with high performance and/or high efficiency. In another embodiment, processing module 160 may be implemented with a general purpose central processing unit (CPU) which may be configured to execute appropriate software instructions to perform image processing, coordinate and perform image processing with various image processing blocks, coordinate interfacing between processing module 160 and host device 102, and/or other operations. In yet another embodiment, processing module 160 may be implemented with a field programmable gate array (FPGA). Processing module 160 may be implemented with other types of processing and/or logic circuits in other embodiments as would be understood by one skilled in the art.

In these and other embodiments, processing module 160 may also be implemented with other components where appropriate, such as, volatile memory, non-volatile memory, and/or one or more interfaces (e.g., infrared detector interfaces, inter-integrated circuit (I2C) interfaces, mobile industry processor interfaces (MIPI), joint test action group (JTAG) interfaces (e.g., IEEE 1149.1 standard test access port and boundary-scan architecture), and/or other interfaces).

In some embodiments, infrared imaging module 100 may further include one or more actuators 199 which may be used to adjust the focus of infrared image frames captured by infrared sensor assembly 128. For example, actuators 199 may be used to move optical element 180, infrared sensors 132, and/or other components relative to each other to selectively focus and defocus infrared image frames in accordance with techniques described herein. Actuators 199 may be implemented in accordance with any type of motion-inducing apparatus or mechanism, and may positioned at any location within or external to infrared imaging module 100 as appropriate for different applications.

When infrared imaging module 100 is assembled, housing 120 may substantially enclose infrared sensor assembly 128, base 150, and processing module 160. Housing 120 may facilitate connection of various components of infrared imaging module 100. For example, in one embodiment, housing 120 may provide electrical connections 126 to connect various components as further described.

Electrical connections 126 (e.g., conductive electrical paths, traces, or other types of connections) may be electrically connected with bond pads 142 when infrared imaging module 100 is assembled. In various embodiments, electrical connections 126 may be embedded in housing 120, provided on inside surfaces of housing 120, and/or otherwise provided by housing 120. Electrical connections 126 may terminate in connections 124 protruding from the bottom surface of housing 120 as shown in FIG. 3. Connections 124 may connect with circuit board 170 when infrared imaging module 100 is assembled (e.g., housing 120 may rest atop circuit board 170 in various embodiments). Processing module 160 may be electrically connected with circuit board 170 through appropriate electrical connections. As a result, infrared sensor assembly 128 may be electrically connected with processing module 160 through, for example, conductive electrical paths provided by: bond pads 142, complementary connections on inside surfaces of housing 120, electrical connections 126 of housing 120, connections 124, and circuit board 170. Advantageously, such an arrangement may be implemented without requiring wire bonds to be provided between infrared sensor assembly 128 and processing module 160.

In various embodiments, electrical connections 126 in housing 120 may be made from any desired material (e.g., copper or any other appropriate conductive material). In one embodiment, electrical connections 126 may aid in dissipating heat from infrared imaging module 100.

Other connections may be used in other embodiments. For example, in one embodiment, sensor assembly 128 may be attached to processing module 160 through a ceramic board that connects to sensor assembly 128 by wire bonds and to processing module 160 by a ball grid array (BGA). In another embodiment, sensor assembly 128 may be mounted directly on a rigid flexible board and electrically connected with wire bonds, and processing module 160 may be mounted and connected to the rigid flexible board with wire bonds or a BGA.

The various implementations of infrared imaging module 100 and host device 102 set forth herein are provided for purposes of example, rather than limitation. In this regard, any of the various techniques described herein may be applied to any infrared camera system, infrared imager, or other device for performing infrared/thermal imaging.

Substrate 140 of infrared sensor assembly 128 may be mounted on base 150. In various embodiments, base 150 (e.g., a pedestal) may be made, for example, of copper formed by metal injection molding (MIM) and provided with a black oxide or nickel-coated finish. In various embodiments, base 150 may be made of any desired material, such as for example zinc, aluminum, or magnesium, as desired for a given application and may be formed by any desired applicable process, such as for example aluminum casting, MIM, or zinc rapid casting, as may be desired for particular applications.

In various embodiments, base 150 may be implemented to provide structural support, various circuit paths, thermal heat sink properties, and other features where appropriate. In one embodiment, base 150 may be a multi-layer structure implemented at least in part using ceramic material.

In various embodiments, circuit board 170 may receive housing 120 and thus may physically support the various components of infrared imaging module 100. In various embodiments, circuit board 170 may be implemented as a printed circuit board (e.g., an FR4 circuit board or other types of circuit boards), a rigid or flexible interconnect (e.g., tape or other type of interconnects), a flexible circuit substrate, a flexible plastic substrate, or other appropriate structures. In various embodiments, base 150 may be implemented with the various features and attributes described for circuit board 170, and vice versa.

Socket 104 may include a cavity 106 configured to receive infrared imaging module 100 (e.g., as shown in the assembled view of FIG. 2). Infrared imaging module 100 and/or socket 104 may include appropriate tabs, arms, pins, fasteners, or any other appropriate engagement members which may be used to secure infrared imaging module 100 to or within socket 104 using friction, tension, adhesion, and/or any other appropriate manner. Socket 104 may include engagement members 107 that may engage surfaces 109 of housing 120 when infrared imaging module 100 is inserted into a cavity 106 of socket 104. Other types of engagement members may be used in other embodiments.

Infrared imaging module 100 may be electrically connected with socket 104 through appropriate electrical connections (e.g., contacts, pins, wires, or any other appropriate connections). For example, socket 104 may include electrical connections 108 which may contact corresponding electrical connections of infrared imaging module 100 (e.g., interconnect pads, contacts, or other electrical connections on side or bottom surfaces of circuit board 170, bond pads 142 or other electrical connections on base 150, or other connections). Electrical connections 108 may be made from any desired material (e.g., copper or any other appropriate conductive material). In one embodiment, electrical connections 108 may be mechanically biased to press against electrical connections of infrared imaging module 100 when infrared imaging module 100 is inserted into cavity 106 of socket 104. In one embodiment, electrical connections 108 may at least partially secure infrared imaging module 100 in socket 104. Other types of electrical connections may be used in other embodiments.

Socket 104 may be electrically connected with host device 102 through similar types of electrical connections. For example, in one embodiment, host device 102 may include electrical connections (e.g., soldered connections, snap-in connections, or other connections) that connect with electrical connections 108 passing through apertures 190. In various embodiments, such electrical connections may be made to the sides and/or bottom of socket 104.

Various components of infrared imaging module 100 may be implemented with flip chip technology which may be used to mount components directly to circuit boards without the additional clearances typically needed for wire bond connections. Flip chip connections may be used, as an example, to reduce the overall size of infrared imaging module 100 for use in compact small form factor applications. For example, in one embodiment, processing module 160 may be mounted to circuit board 170 using flip chip connections. For example, infrared imaging module 100 may be implemented with such flip chip configurations.

In various embodiments, infrared imaging module 100 and/or associated components may be implemented in accordance with various techniques (e.g., wafer level packaging techniques) as set forth in U.S. patent application Ser. No. 12/844,124 filed Jul. 27, 2010, and U.S. Provisional Patent Application No. 61/469,651 filed Mar. 30, 2011, which are incorporated herein by reference in their entirety. Furthermore, in accordance with one or more embodiments, infrared imaging module 100 and/or associated components may be implemented, calibrated, tested, and/or used in accordance with various techniques, such as for example as set forth in U.S. Pat. No. 7,470,902 issued Dec. 30, 2008, U.S. Pat. No. 6,028,309 issued Feb. 22, 2000, U.S. Pat. No. 6,812,465 issued Nov. 2, 2004, U.S. Pat. No. 7,034,301 issued Apr. 25, 2006, U.S. Pat. No. 7,679,048 issued Mar. 16, 2010, U.S. Pat. No. 7,470,904 issued Dec. 30, 2008, U.S. patent application Ser. No. 12/202,880 filed Sep. 2, 2008, and U.S. patent application Ser. No. 12/202,896 filed Sep. 2, 2008, which are incorporated herein by reference in their entirety.

As discussed, in some embodiments, host device 102 may include other components 198 such as a non-thermal camera (e.g., visible light camera). The non-thermal camera may be a small form factor imaging module or imaging device, and may be implemented in a similar manner as various embodiments of infrared imaging module 100 disclosed herein, but with one or more sensors responsive to radiation in the non-thermal spectrum (e.g., radiation in visible light wavelengths, ultraviolet wavelengths, or other non-thermal wavelengths). For example, in some embodiments, the non-thermal camera may be implemented with a charge-coupled device (CCD) sensor, an electron multiplying CCD (EM-CCD) sensor, a complementary metal-oxide-semiconductor (CMOS) sensor, a scientific CMOS (sCMOS) sensor, or other sensors.

In some embodiments, the non-thermal camera may be co-located with infrared imaging module 100 and oriented such that a field-of-view (FOV) of the non-thermal camera at least partially overlaps a FOV of infrared imaging module 100. In one example, infrared imaging module 100 and the non-thermal camera may be implemented as a dual sensor module sharing a common substrate according to various techniques described in U.S. Provisional Patent Application No. 61/748,018 incorporated by reference herein.

For embodiments of host device 102 having such a non-thermal light camera, various components (e.g., processor 195, processing module 160, and/or other processing component) may be configured to superimpose, fuse, blend, or otherwise combine infrared images (e.g., including thermal images) captured by infrared imaging module 100 and non-thermal images (e.g., including visible light images) captured by the non-thermal camera, in accordance with various techniques disclosed in, for example, U.S. patent application Ser. No. 61/473,207, 12/766,739, 13/105,765, or 13/437,645, or International Patent Application No. PCT/EP2011/056432, all incorporated by reference herein.

Referring again to FIG. 1, in various embodiments, host device 102 may include shutter 105. In this regard, shutter 105 may be selectively positioned over socket 104 (e.g., as identified by arrows 103) while infrared imaging module 100 is installed therein. In this regard, shutter 105 may be used, for example, to protect infrared imaging module 100 when not in use. Shutter 105 may also be used as a temperature reference as part of a calibration process (e.g., a NUC process or other calibration processes) for infrared imaging module 100 as would be understood by one skilled in the art.

In various embodiments, shutter 105 may be made from various materials such as, for example, polymers, glass, aluminum (e.g., painted or anodized) or other materials. In various embodiments, shutter 105 may include one or more coatings to selectively filter electromagnetic radiation and/or adjust various optical properties of shutter 105 (e.g., a uniform blackbody coating or a reflective gold coating).

In another embodiment, shutter 105 may be fixed in place to protect infrared imaging module 100 at all times. In this case, shutter 105 or a portion of shutter 105 may be made from appropriate materials (e.g., polymers or infrared transmitting materials such as silicon, germanium, zinc selenide, or chalcogenide glasses) that do not substantially filter desired infrared wavelengths. In another embodiment, a shutter may be implemented as part of infrared imaging module 100 (e.g., within or as part of a lens barrel or other components of infrared imaging module 100), as would be understood by one skilled in the art.

Alternatively, in another embodiment, a shutter (e.g., shutter 105 or other type of external or internal shutter) need not be provided, but rather a NUC process or other type of calibration may be performed using shutterless techniques. In another embodiment, a NUC process or other type of calibration using shutterless techniques may be performed in combination with shutter-based techniques.

Infrared imaging module 100 and host device 102 may be implemented in accordance with any of the various techniques set forth in U.S. Provisional Patent Application No. 61/495,873 filed Jun. 10, 2011, U.S. Provisional Patent Application No. 61/495,879 filed Jun. 10, 2011, and U.S. Provisional Patent Application No. 61/495,888 filed Jun. 10, 2011, which are incorporated herein by reference in their entirety.

In various embodiments, the components of host device 102 and/or infrared imaging module 100 may be implemented as a local or distributed system with components in communication with each other over wired and/or wireless networks. Accordingly, the various operations identified in this disclosure may be performed by local and/or remote components as may be desired in particular implementations.

Figure 5:
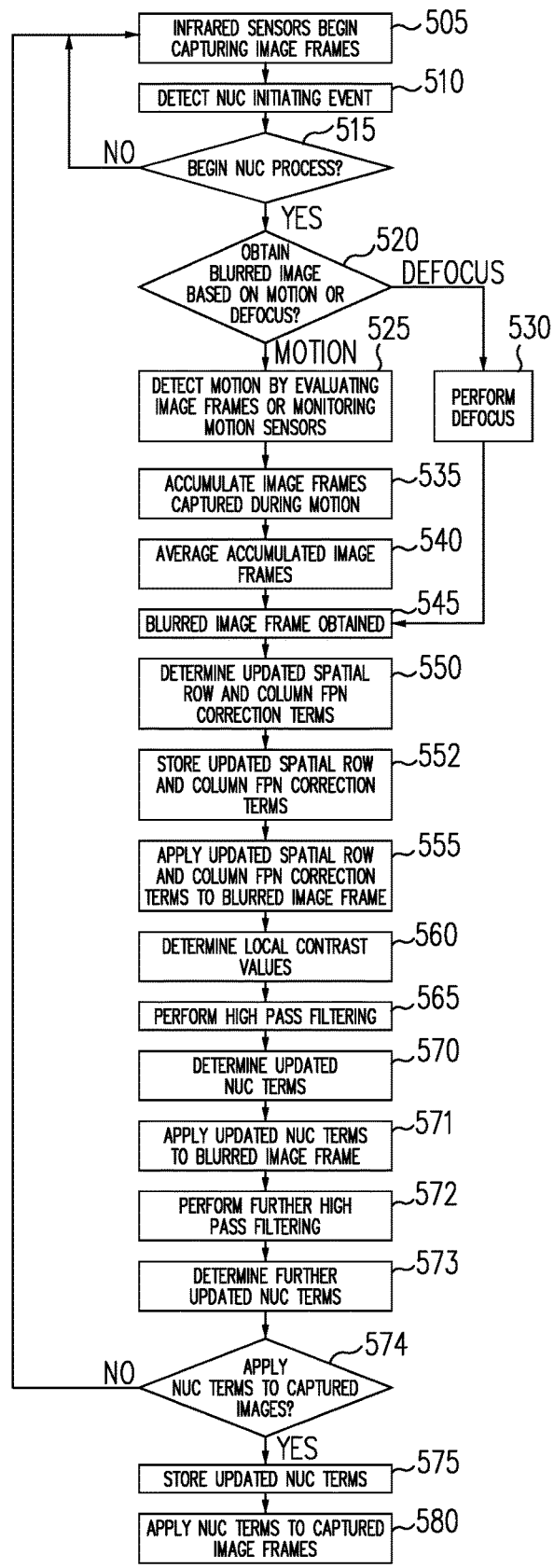
FIG. 5 illustrates a flow diagram of various operations to determine non-uniformity correction (NUC) terms in accordance with an embodiment of the disclosure.

FIG. 5 illustrates a flow diagram of various operations to determine NUC terms in accordance with an embodiment of the disclosure. In some embodiments, the operations of FIG. 5 may be performed by processing module 160 or processor 195 (both also generally referred to as a processor) operating on image frames captured by infrared sensors 132.

In block 505, infrared sensors 132 begin capturing image frames of a scene. Typically, the scene will be the real world environment in which host device 102 is currently located. In this regard, shutter 105 (if optionally provided) may be opened to permit infrared imaging module to receive infrared radiation from the scene. Infrared sensors 132 may continue capturing image frames during all operations shown in FIG. 5. In this regard, the continuously captured image frames may be used for various operations as further discussed. In one embodiment, the captured image frames may be temporally filtered (e.g., in accordance with the process of block 826 further described herein with regard to FIG. 8) and be processed by other terms (e.g., factory gain terms 812, factory offset terms 816, previously determined NUC terms 817, column FPN terms 820, and row FPN terms 824 as further described herein with regard to FIG. 8) before they are used in the operations shown in FIG. 5.

In block 510, a NUC process initiating event is detected. In one embodiment, the NUC process may be initiated in response to physical movement of host device 102. Such movement may be detected, for example, by motion sensors 194 which may be polled by a processor. In one example, a user may move host device 102 in a particular manner, such as by intentionally waving host device 102 back and forth in an "erase" or "swipe" movement. In this regard, the user may move host device 102 in accordance with a predetermined speed and direction (velocity), such as in an up and down, side to side, or other pattern to initiate the NUC process. In this example, the use of such movements may permit the user to intuitively operate host device 102 to simulate the "erasing" of noise in captured image frames.

In another example, a NUC process may be initiated by host device 102 if motion exceeding a threshold value is detected (e.g., motion greater than expected for ordinary use). It is contemplated that any desired type of spatial translation of host device 102 may be used to initiate the NUC process.

In yet another example, a NUC process may be initiated by host device 102 if a minimum time has elapsed since a previously performed NUC process. In a further example, a NUC process may be initiated by host device 102 if infrared imaging module 100 has experienced a minimum temperature change since a previously performed NUC process. In a still further example, a NUC process may be continuously initiated and repeated.

In block 515, after a NUC process initiating event is detected, it is determined whether the NUC process should actually be performed. In this regard, the NUC process may be selectively initiated based on whether one or more additional conditions are met. For example, in one embodiment, the NUC process may not be performed unless a minimum time has elapsed since a previously performed NUC process. In another embodiment, the NUC process may not be performed unless infrared imaging module 100 has experienced a minimum temperature change since a previously performed NUC process. Other criteria or conditions may be used in other embodiments. If appropriate criteria or conditions have been met, then the flow diagram continues to block 520. Otherwise, the flow diagram returns to block 505.

In the NUC process, blurred image frames may be used to determine NUC terms which may be applied to captured image frames to correct for FPN. As discussed, in one embodiment, the blurred image frames may be obtained by accumulating multiple image frames of a moving scene (e.g., captured while the scene and/or the thermal imager is in motion). In another embodiment, the blurred image frames may be obtained by defocusing an optical element or other component of the thermal imager.

Accordingly, in block 520 a choice of either approach is provided. If the motion-based approach is used, then the flow diagram continues to block 525. If the defocus-based approach is used, then the flow diagram continues to block 530.

Referring now to the motion-based approach, in block 525 motion is detected. For example, in one embodiment, motion may be detected based on the image frames captured by infrared sensors 132. In this regard, an appropriate motion detection process (e.g., an image registration process, a frame-to-frame difference calculation, or other appropriate process) may be applied to captured image frames to determine whether motion is present (e.g., whether static or moving image frames have been captured). For example, in one embodiment, it can be determined whether pixels or regions around the pixels of consecutive image frames have changed more than a user defined amount (e.g., a percentage and/or threshold value). If at least a given percentage of pixels have changed by at least the user defined amount, then motion will be detected with sufficient certainty to proceed to block 535.

In another embodiment, motion may be determined on a per pixel basis, wherein only pixels that exhibit significant changes are accumulated to provide the blurred image frame. For example, counters may be provided for each pixel and used to ensure that the same number of pixel values are accumulated for each pixel, or used to average the pixel values based on the number of pixel values actually accumulated for each pixel. Other types of image-based motion detection may be performed such as performing a Radon transform.

In another embodiment, motion may be detected based on data provided by motion sensors 194. In one embodiment, such motion detection may include detecting whether host device 102 is moving along a relatively straight trajectory through space. For example, if host device 102 is moving along a relatively straight trajectory, then it is possible that certain objects appearing in the imaged scene may not be sufficiently blurred (e.g., objects in the scene that may be aligned with or moving substantially parallel to the straight trajectory). Thus, in such an embodiment, the motion detected by motion sensors 194 may be conditioned on host device 102 exhibiting, or not exhibiting, particular trajectories.

In yet another embodiment, both a motion detection process and motion sensors 194 may be used. Thus, using any of these various embodiments, a determination can be made as to whether or not each image frame was captured while at least a portion of the scene and host device 102 were in motion relative to each other (e.g., which may be caused by host device 102 moving relative to the scene, at least a portion of the scene moving relative to host device 102, or both).

It is expected that the image frames for which motion was detected may exhibit some secondary blurring of the captured scene (e.g., blurred thermal image data associated with the scene) due to the thermal time constants of infrared sensors 132 (e.g., microbolometer thermal time constants) interacting with the scene movement.

In block 535, image frames for which motion was detected are accumulated. For example, if motion is detected for a continuous series of image frames, then the image frames of the series may be accumulated. As another example, if motion is detected for only some image frames, then the non-moving image frames may be skipped and not included in the accumulation. Thus, a continuous or discontinuous set of image frames may be selected to be accumulated based on the detected motion.

In block 540, the accumulated image frames are averaged to provide a blurred image frame. Because the accumulated image frames were captured during motion, it is expected that actual scene information will vary between the image frames and thus cause the scene information to be further blurred in the resulting blurred image frame (block 545).

In contrast, FPN (e.g., caused by one or more components of infrared imaging module 100) will remain fixed over at least short periods of time and over at least limited changes in scene irradiance during motion. As a result, image frames captured in close proximity in time and space during motion will suffer from identical or at least very similar FPN. Thus, although scene information may change in consecutive image frames, the FPN will stay essentially constant. By averaging, multiple image frames captured during motion will blur the scene information, but will not blur the FPN. As a result, FPN will remain more clearly defined in the blurred image frame provided in block 545 than the scene information.

In one embodiment, 32 or more image frames are accumulated and averaged in blocks 535 and 540. However, any desired number of image frames may be used in other embodiments, but with generally decreasing correction accuracy as frame count is decreased.

Referring now to the defocus-based approach, in block 530, a defocus operation may be performed to intentionally defocus the image frames captured by infrared sensors 132. For example, in one embodiment, one or more actuators 199 may be used to adjust, move, or otherwise translate optical element 180, infrared sensor assembly 128, and/or other components of infrared imaging module 100 to cause infrared sensors 132 to capture a blurred (e.g., unfocused) image frame of the scene. Other non-actuator based techniques are also contemplated for intentionally defocusing infrared image frames such as, for example, manual (e.g., user-initiated) defocusing.

Although the scene may appear blurred in the image frame, FPN (e.g., caused by one or more components of infrared imaging module 100) will remain unaffected by the defocusing operation. As a result, a blurred image frame of the scene will be provided (block 545) with FPN remaining more clearly defined in the blurred image than the scene information.

In the above discussion, the defocus-based approach has been described with regard to a single captured image frame. In another embodiment, the defocus-based approach may include accumulating multiple image frames while the infrared imaging module 100 has been defocused and averaging the defocused image frames to remove the effects of temporal noise and provide a blurred image frame in block 545.

Thus, it will be appreciated that a blurred image frame may be provided in block 545 by either the motion-based approach or the defocus-based approach. Because much of the scene information will be blurred by either motion, defocusing, or both, the blurred image frame may be effectively considered a low pass filtered version of the original captured image frames with respect to scene information.

In block 550, the blurred image frame is processed to determine updated row and column FPN terms (e.g., if row and column FPN terms have not been previously determined then the updated row and column FPN terms may be new row and column FPN terms in the first iteration of block 550). As used in this disclosure, the terms row and column may be used interchangeably depending on the orientation of infrared sensors 132 and/or other components of infrared imaging module 100.

In one embodiment, block 550 includes determining a spatial FPN correction term for each row of the blurred image frame (e.g., each row may have its own spatial FPN correction term), and also determining a spatial FPN correction term for each column of the blurred image frame (e.g., each column may have its own spatial FPN correction term). Such processing may be used to reduce the spatial and slowly varying (1/f) row and column FPN inherent in thermal imagers caused by, for example, 1/f noise characteristics of amplifiers in ROIC 402 which may manifest as vertical and horizontal stripes in image frames.

Advantageously, by determining spatial row and column FPN terms using the blurred image frame, there will be a reduced risk of vertical and horizontal objects in the actual imaged scene from being mistaken for row and column noise (e.g., real scene content will be blurred while FPN remains unblurred).

Figure 6:
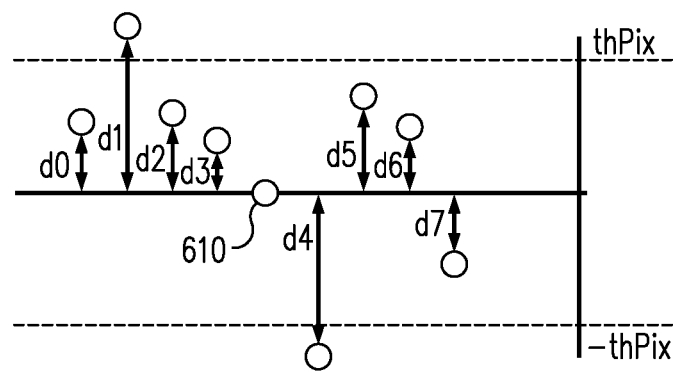
FIG. 6 illustrates differences between neighboring pixels in accordance with an embodiment of the disclosure.

In one embodiment, row and column FPN terms may be determined by considering differences between neighboring pixels of the blurred image frame. For example, FIG. 6 illustrates differences between neighboring pixels in accordance with an embodiment of the disclosure. Specifically, in FIG. 6 a pixel 610 is compared to its 8 nearest horizontal neighbors: d0-d3 on one side and d4-d7 on the other side. Differences between the neighbor pixels can be averaged to obtain an estimate of the offset error of the illustrated group of pixels. An offset error may be calculated for each pixel in a row or column and the average result may be used to correct the entire row or column.

To prevent real scene data from being interpreted as noise, upper and lower threshold values may be used (thPix and −thPix). Pixel values falling outside these threshold values (pixels d1 and d4 in this example) are not used to obtain the offset error. In addition, the maximum amount of row and column FPN correction may be limited by these threshold values.

Further techniques for performing spatial row and column FPN correction processing are set forth in U.S. patent application Ser. No. 12/396,340 filed Mar. 2, 2009 which is incorporated herein by reference in its entirety.

Referring again to FIG. 5, the updated row and column FPN terms determined in block 550 are stored (block 552) and applied (block 555) to the blurred image frame provided in block 545. After these terms are applied, some of the spatial row and column FPN in the blurred image frame may be reduced. However, because such terms are applied generally to rows and columns, additional FPN may remain such as spatially uncorrelated FPN associated with pixel to pixel drift or other causes. Neighborhoods of spatially correlated FPN may also remain which may not be directly associated with individual rows and columns. Accordingly, further processing may be performed as discussed below to determine NUC terms.

In block 560, local contrast values (e.g., edges or absolute values of gradients between adjacent or small groups of pixels) in the blurred image frame are determined. If scene information in the blurred image frame includes contrasting areas that have not been significantly blurred (e.g., high contrast edges in the original scene data), then such features may be identified by a contrast determination process in block 560.

For example, local contrast values in the blurred image frame may be calculated, or any other desired type of edge detection process may be applied to identify certain pixels in the blurred image as being part of an area of local contrast. Pixels that are marked in this manner may be considered as containing excessive high spatial frequency scene information that would be interpreted as FPN (e.g., such regions may correspond to portions of the scene that have not been sufficiently blurred). As such, these pixels may be excluded from being used in the further determination of NUC terms. In one embodiment, such contrast detection processing may rely on a threshold that is higher than the expected contrast value associated with FPN (e.g., pixels exhibiting a contrast value higher than the threshold may be considered to be scene information, and those lower than the threshold may be considered to be exhibiting FPN).

In one embodiment, the contrast determination of block 560 may be performed on the blurred image frame after row and column FPN terms have been applied to the blurred image frame (e.g., as shown in FIG. 5). In another embodiment, block 560 may be performed prior to block 550 to determine contrast before row and column FPN terms are determined (e.g., to prevent scene based contrast from contributing to the determination of such terms).

Following block 560, it is expected that any high spatial frequency content remaining in the blurred image frame may be generally attributed to spatially uncorrelated FPN. In this regard, following block 560, much of the other noise or actual desired scene based information has been removed or excluded from the blurred image frame due to: intentional blurring of the image frame (e.g., by motion or defocusing in blocks 520 through 545), application of row and column FPN terms (block 555), and contrast determination (block 560).

Thus, it can be expected that following block 560, any remaining high spatial frequency content (e.g., exhibited as areas of contrast or differences in the blurred image frame) may be attributed to spatially uncorrelated FPN. Accordingly, in block 565, the blurred image frame is high pass filtered. In one embodiment, this may include applying a high pass filter to extract the high spatial frequency content from the blurred image frame. In another embodiment, this may include applying a low pass filter to the blurred image frame and taking a difference between the low pass filtered image frame and the unfiltered blurred image frame to obtain the high spatial frequency content. In accordance with various embodiments of the present disclosure, a high pass filter may be implemented by calculating a mean difference between a sensor signal (e.g., a pixel value) and its neighbors.

In block 570, a flat field correction process is performed on the high pass filtered blurred image frame to determine updated NUC terms (e.g., if a NUC process has not previously been performed then the updated NUC terms may be new NUC terms in the first iteration of block 570).

Figure 7:
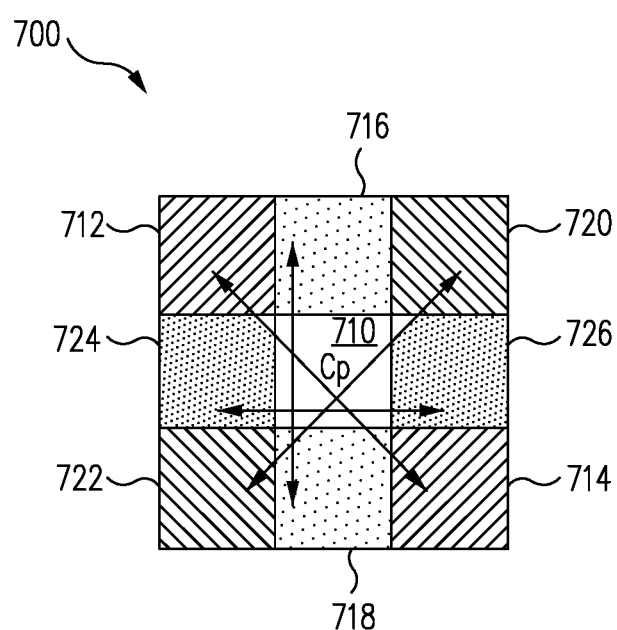
FIG. 7 illustrates a flat field correction technique in accordance with an embodiment of the disclosure.

For example, FIG. 7 illustrates a flat field correction technique 700 in accordance with an embodiment of the disclosure. In FIG. 7, a NUC term may be determined for each pixel 710 of the blurred image frame using the values of its neighboring pixels 712 to 726. For each pixel 710, several gradients may be determined based on the absolute difference between the values of various adjacent pixels. For example, absolute value differences may be determined between: pixels 712 and 714 (a left to right diagonal gradient), pixels 716 and 718 (a top to bottom vertical gradient), pixels 720 and 722 (a right to left diagonal gradient), and pixels 724 and 726 (a left to right horizontal gradient).

These absolute differences may be summed to provide a summed gradient for pixel 710. A weight value may be determined for pixel 710 that is inversely proportional to the summed gradient. This process may be performed for all pixels 710 of the blurred image frame until a weight value is provided for each pixel 710. For areas with low gradients (e.g., areas that are blurry or have low contrast), the weight value will be close to one. Conversely, for areas with high gradients, the weight value will be zero or close to zero. The update to the NUC term as estimated by the high pass filter is multiplied with the weight value.

In one embodiment, the risk of introducing scene information into the NUC terms can be further reduced by applying some amount of temporal damping to the NUC term determination process. For example, a temporal damping factor $\lambda$ between 0 and 1 may be chosen such that the new NUC term ($NUC_{NEW}$) stored is a weighted average of the old NUC term ($NUC_{OLD}$) and the estimated updated NUC term ($NUC_{UPDATE}$). In one embodiment, this can be expressed as $NUC_{NEW} = \lambda \cdot NUC_{OLD} + (1-\lambda) \cdot (NUC_{OLD} + NUC_{UPDATE})$.

Although the determination of NUC terms has been described with regard to gradients, local contrast values may be used instead where appropriate. Other techniques may also be used such as, for example, standard deviation calculations. Other types flat field correction processes may be performed to determine NUC terms including, for example, various processes identified in U.S. Pat. No. 6,028,309 issued Feb. 22, 2000, U.S. Pat. No. 6,812,465 issued Nov. 2, 2004, and U.S. patent application Ser. No. 12/114,865 filed May 5, 2008, which are incorporated herein by reference in their entirety.

Referring again to FIG. 5, block 570 may include additional processing of the NUC terms. For example, in one embodiment, to preserve the scene signal mean, the sum of all NUC terms may be normalized to zero by subtracting the NUC term mean from each NUC term. Also in block 570, to avoid row and column noise from affecting the NUC terms, the mean value of each row and column may be subtracted from the NUC terms for each row and column. As a result, row and column FPN filters using the row and column FPN terms determined in block 550 may be better able to filter out row and column noise in further iterations (e.g., as further shown in FIG. 8) after the NUC terms are applied to captured images (e.g., in block 580 further discussed herein). In this regard, the row and column FPN filters may in general use more data to calculate the per row and per column offset coefficients (e.g., row and column FPN terms) and may thus provide a more robust alternative for reducing spatially correlated FPN than the NUC terms which are based on high pass filtering to capture spatially uncorrelated noise.

In blocks 571-573, additional high pass filtering and further determinations of updated NUC terms may be optionally performed to remove spatially correlated FPN with lower spatial frequency than previously removed by row and column FPN terms. In this regard, some variability in infrared sensors 132 or other components of infrared imaging module 100 may result in spatially correlated FPN noise that cannot be easily modeled as row or column noise. Such spatially correlated FPN may include, for example, window defects on a sensor package or a cluster of infrared sensors 132 that respond differently to irradiance than neighboring infrared sensors 132. In one embodiment, such spatially correlated FPN may be mitigated with an offset correction. If the amount of such spatially correlated FPN is significant, then the noise may also be detectable in the blurred image frame. Since this type of noise may affect a neighborhood of pixels, a high pass filter with a small kernel may not detect the FPN in the neighborhood (e.g., all values used in high pass filter may be taken from the neighborhood of affected pixels and thus may be affected by the same offset error). For example, if the high pass filtering of block 565 is performed with a small kernel (e.g., considering only immediately adjacent pixels that fall within a neighborhood of pixels affected by spatially correlated FPN), then broadly distributed spatially correlated FPN may not be detected.

Figure 11:
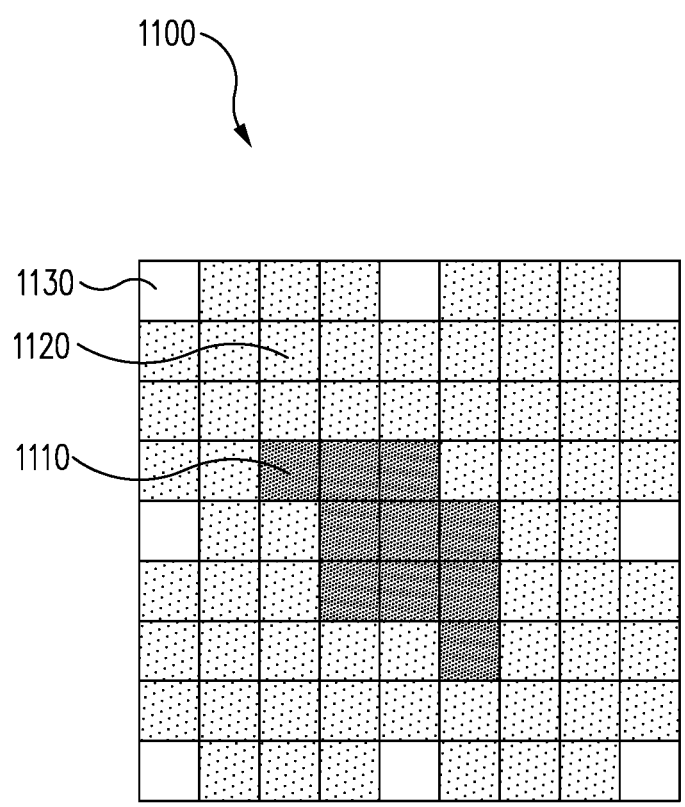
FIG. 11 illustrates spatially correlated fixed pattern noise (FPN) in a neighborhood of pixels in accordance with an embodiment of the disclosure.

For example, FIG. 11 illustrates spatially correlated FPN in a neighborhood of pixels in accordance with an embodiment of the disclosure. As shown in a sample image frame 1100, a neighborhood of pixels 1110 may exhibit spatially correlated FPN that is not precisely correlated to individual rows and columns and is distributed over a neighborhood of several pixels (e.g., a neighborhood of approximately 4 by 4 pixels in this example). Sample image frame 1100 also includes a set of pixels 1120 exhibiting substantially uniform response that are not used in filtering calculations, and a set of pixels 1130 that are used to estimate a low pass value for the neighborhood of pixels 1110. In one embodiment, pixels 1130 may be a number of pixels divisible by two in order to facilitate efficient hardware or software calculations.

Referring again to FIG. 5, in blocks 571-573, additional high pass filtering and further determinations of updated NUC terms may be optionally performed to remove spatially correlated FPN such as exhibited by pixels 1110. In block 571, the updated NUC terms determined in block 570 are applied to the blurred image frame. Thus, at this time, the blurred image frame will have been initially corrected for spatially correlated FPN (e.g., by application of the updated row and column FPN terms in block 555), and also initially corrected for spatially uncorrelated FPN (e.g., by application of the updated NUC terms applied in block 571).

In block 572, a further high pass filter is applied with a larger kernel than was used in block 565, and further updated NUC terms may be determined in block 573. For example, to detect the spatially correlated FPN present in pixels 1110, the high pass filter applied in block 572 may include data from a sufficiently large enough neighborhood of pixels such that differences can be determined between unaffected pixels (e.g., pixels 1120) and affected pixels (e.g., pixels 1110). For example, a low pass filter with a large kernel can be used (e.g., an N by N kernel that is much greater than 3 by 3 pixels) and the results may be subtracted to perform appropriate high pass filtering.

In one embodiment, for computational efficiency, a sparse kernel may be used such that only a small number of neighboring pixels inside an N by N neighborhood are used. For any given high pass filter operation using distant neighbors (e.g., a large kernel), there is a risk of modeling actual (potentially blurred) scene information as spatially correlated FPN. Accordingly, in one embodiment, the temporal damping factor $\lambda$ may be set close to 1 for updated NUC terms determined in block 573.

In various embodiments, blocks 571-573 may be repeated (e.g., cascaded) to iteratively perform high pass filtering with increasing kernel sizes to provide further updated NUC terms further correct for spatially correlated FPN of desired neighborhood sizes. In one embodiment, the decision to perform such iterations may be determined by whether spatially correlated FPN has actually been removed by the updated NUC terms of the previous performance of blocks 571-573.

After blocks 571-573 are finished, a decision is made regarding whether to apply the updated NUC terms to captured image frames (block 574). For example, if an average of the absolute value of the NUC terms for the entire image frame is less than a minimum threshold value, or greater than a maximum threshold value, the NUC terms may be deemed spurious or unlikely to provide meaningful correction. Alternatively, thresholding criteria may be applied to individual pixels to determine which pixels receive updated NUC terms. In one embodiment, the threshold values may correspond to differences between the newly calculated NUC terms and previously calculated NUC terms. In another embodiment, the threshold values may be independent of previously calculated NUC terms. Other tests may be applied (e.g., spatial correlation tests) to determine whether the NUC terms should be applied.

If the NUC terms are deemed spurious or unlikely to provide meaningful correction, then the flow diagram returns to block 505. Otherwise, the newly determined NUC terms are stored (block 575) to replace previous NUC terms (e.g., determined by a previously performed iteration of FIG. 5) and applied (block 580) to captured image frames.

Figure 8:
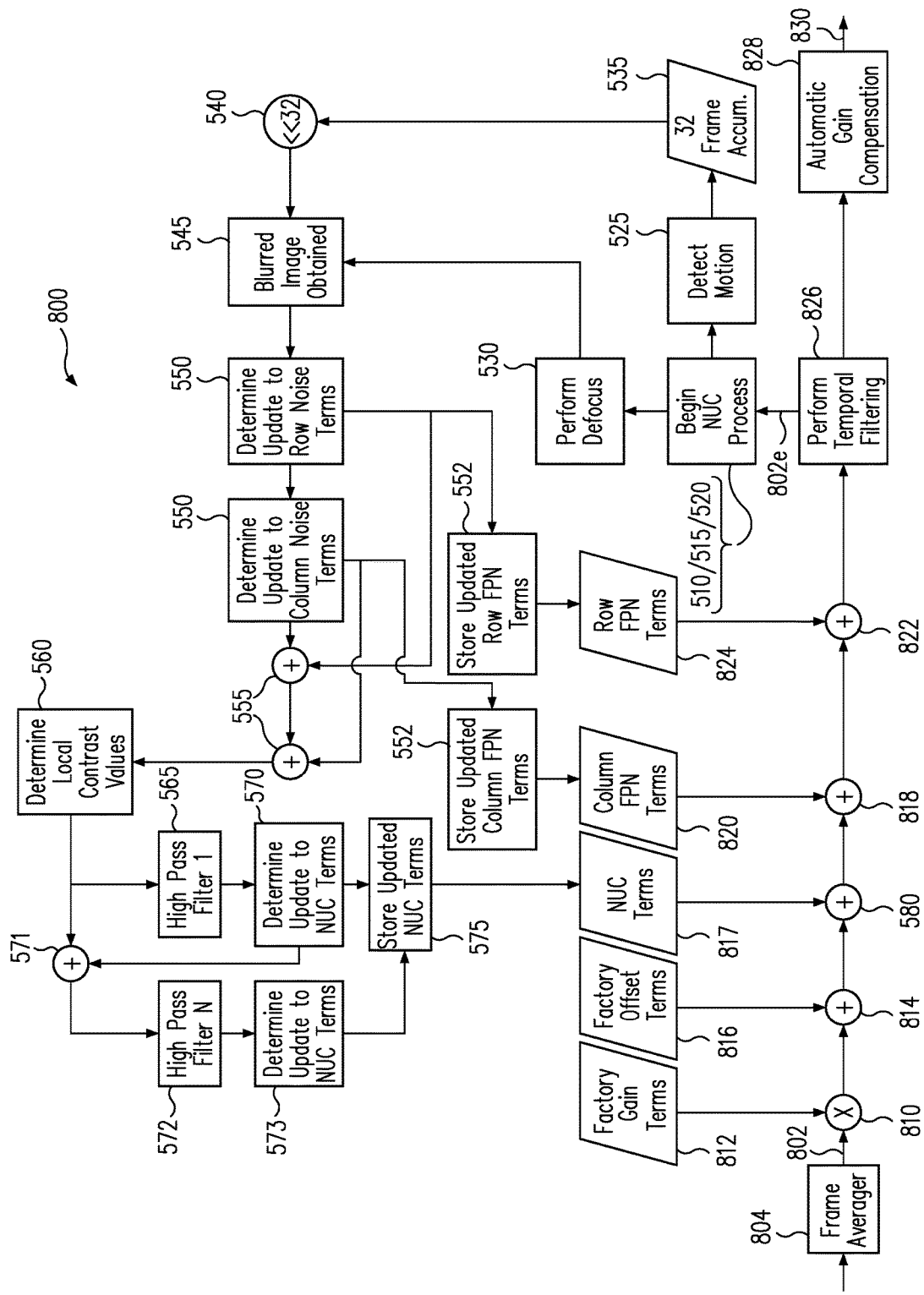
FIG. 8 illustrates various image processing techniques of FIG. 5 and other operations applied in an image processing pipeline in accordance with an embodiment of the disclosure.

FIG. 8 illustrates various image processing techniques of FIG. 5 and other operations applied in an image processing pipeline 800 in accordance with an embodiment of the disclosure. In this regard, pipeline 800 identifies various operations of FIG. 5 in the context of an overall iterative image processing scheme for correcting image frames provided by infrared imaging module 100. In some embodiments, pipeline 800 may be provided by processing module 160 or processor 195 (both also generally referred to as a processor) operating on image frames captured by infrared sensors 132.

Image frames captured by infrared sensors 132 may be provided to a frame averager 804 that integrates multiple image frames to provide image frames 802 with an improved signal to noise ratio. Frame averager 804 may be effectively provided by infrared sensors 132, ROIC 402, and other components of infrared sensor assembly 128 that are implemented to support high image capture rates. For example, in one embodiment, infrared sensor assembly 128 may capture infrared image frames at a frame rate of 240 Hz (e.g., 240 images per second). In this embodiment, such a high frame rate may be implemented, for example, by operating infrared sensor assembly 128 at relatively low voltages (e.g., compatible with mobile telephone voltages) and by using a relatively small array of infrared sensors 132 (e.g., an array of 64 by 64 infrared sensors in one embodiment).

In one embodiment, such infrared image frames may be provided from infrared sensor assembly 128 to processing module 160 at a high frame rate (e.g., 240 Hz or other frame rates). In another embodiment, infrared sensor assembly 128 may integrate over longer time periods, or multiple time periods, to provide integrated (e.g., averaged) infrared image frames to processing module 160 at a lower frame rate (e.g., 30 Hz, 9 Hz, or other frame rates). Further information regarding implementations that may be used to provide high image capture rates may be found in U.S. Provisional Patent Application No. 61/495,879 previously referenced herein.

Image frames 802 proceed through pipeline 800 where they are adjusted by various terms, temporally filtered, used to determine the various adjustment terms, and gain compensated.

In blocks 810 and 814, factory gain terms 812 and factory offset terms 816 are applied to image frames 802 to compensate for gain and offset differences, respectively, between the various infrared sensors 132 and/or other components of infrared imaging module 100 determined during manufacturing and testing.

In block 580, NUC terms 817 are applied to image frames 802 to correct for FPN as discussed. In one embodiment, if NUC terms 817 have not yet been determined (e.g., before a NUC process has been initiated), then block 580 may not be performed or initialization values may be used for NUC terms 817 that result in no alteration to the image data (e.g., offsets for every pixel would be equal to zero).

In blocks 818 and 822, column FPN terms 820 and row FPN terms 824, respectively, are applied to image frames 802. Column FPN terms 820 and row FPN terms 824 may be determined in accordance with block 550 as discussed. In one embodiment, if the column FPN terms 820 and row FPN terms 824 have not yet been determined (e.g., before a NUC process has been initiated), then blocks 818 and 822 may not be performed or initialization values may be used for the column FPN terms 820 and row FPN terms 824 that result in no alteration to the image data (e.g., offsets for every pixel would be equal to zero).

Figure 9:
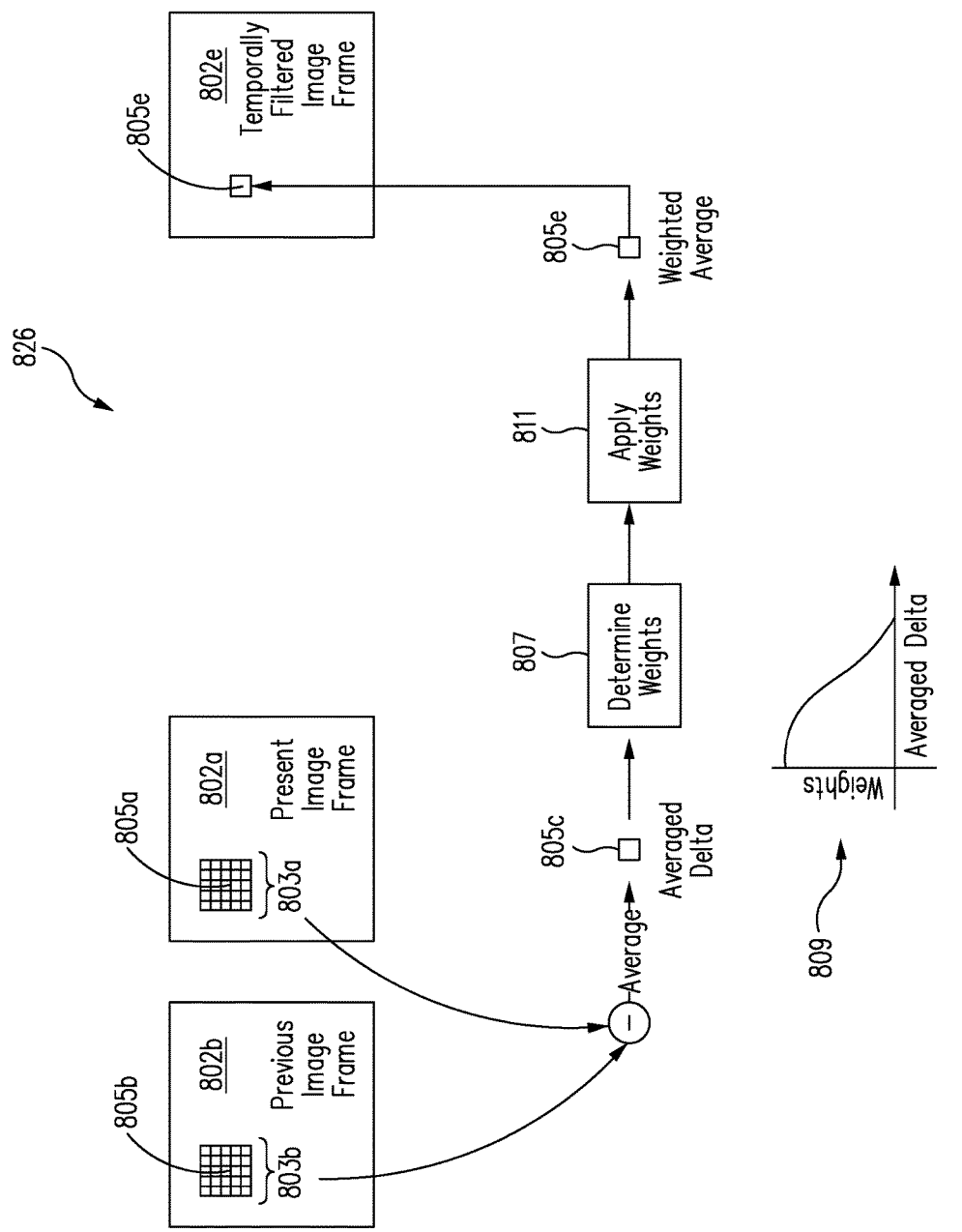
FIG. 9 illustrates a temporal noise reduction process in accordance with an embodiment of the disclosure.

In block 826, temporal filtering is performed on image frames 802 in accordance with a temporal noise reduction (TNR) process. FIG. 9 illustrates a TNR process in accordance with an embodiment of the disclosure. In FIG. 9, a presently received image frame 802a and a previously temporally filtered image frame 802b are processed to determine a new temporally filtered image frame 802e. Image frames 802a and 802b include local neighborhoods of pixels 803a and 803b centered around pixels 805a and 805b, respectively. Neighborhoods 803a and 803b correspond to the same locations within image frames 802a and 802b and are subsets of the total pixels in image frames 802a and 802b. In the illustrated embodiment, neighborhoods 803a and 803b include areas of 5 by 5 pixels. Other neighborhood sizes may be used in other embodiments.

Differences between corresponding pixels of neighborhoods 803a and 803b are determined and averaged to provide an averaged delta value 805c for the location corresponding to pixels 805a and 805b. Averaged delta value 805c may be used to determine weight values in block 807 to be applied to pixels 805a and 805b of image frames 802a and 802b.

In one embodiment, as shown in graph 809, the weight values determined in block 807 may be inversely proportional to averaged delta value 805c such that weight values drop rapidly towards zero when there are large differences between neighborhoods 803a and 803b. In this regard, large differences between neighborhoods 803a and 803b may indicate that changes have occurred within the scene (e.g., due to motion) and pixels 802a and 802b may be appropriately weighted, in one embodiment, to avoid introducing blur across frame-to-frame scene changes. Other associations between weight values and averaged delta value 805c may be used in various embodiments.

The weight values determined in block 807 may be applied to pixels 805a and 805b to determine a value for corresponding pixel 805e of image frame 802e (block 811). In this regard, pixel 805e may have a value that is a weighted average (or other combination) of pixels 805a and 805b, depending on averaged delta value 805c and the weight values determined in block 807.

For example, pixel 805e of temporally filtered image frame 802e may be a weighted sum of pixels 805a and 805b of image frames 802a and 802b. If the average difference between pixels 805a and 805b is due to noise, then it may be expected that the average change between neighborhoods 805a and 805b will be close to zero (e.g., corresponding to the average of uncorrelated changes). Under such circumstances, it may be expected that the sum of the differences between neighborhoods 805a and 805b will be close to zero. In this case, pixel 805a of image frame 802a may both be appropriately weighted so as to contribute to the value of pixel 805e.

However, if the sum of such differences is not zero (e.g., even differing from zero by a small amount in one embodiment), then the changes may be interpreted as being attributed to motion instead of noise. Thus, motion may be detected based on the average change exhibited by neighborhoods 805a and 805b. Under these circumstances, pixel 805a of image frame 802a may be weighted heavily, while pixel 805b of image frame 802b may be weighted lightly.

Other embodiments are also contemplated. For example, although averaged delta value 805c has been described as being determined based on neighborhoods 805a and 805b, in other embodiments averaged delta value 805c may be determined based on any desired criteria (e.g., based on individual pixels or other types of groups of sets of pixels).

In the above embodiments, image frame 802a has been described as a presently received image frame and image frame 802b has been described as a previously temporally filtered image frame. In another embodiment, image frames 802a and 802b may be first and second image frames captured by infrared imaging module 100 that have not been temporally filtered.

Figure 10:
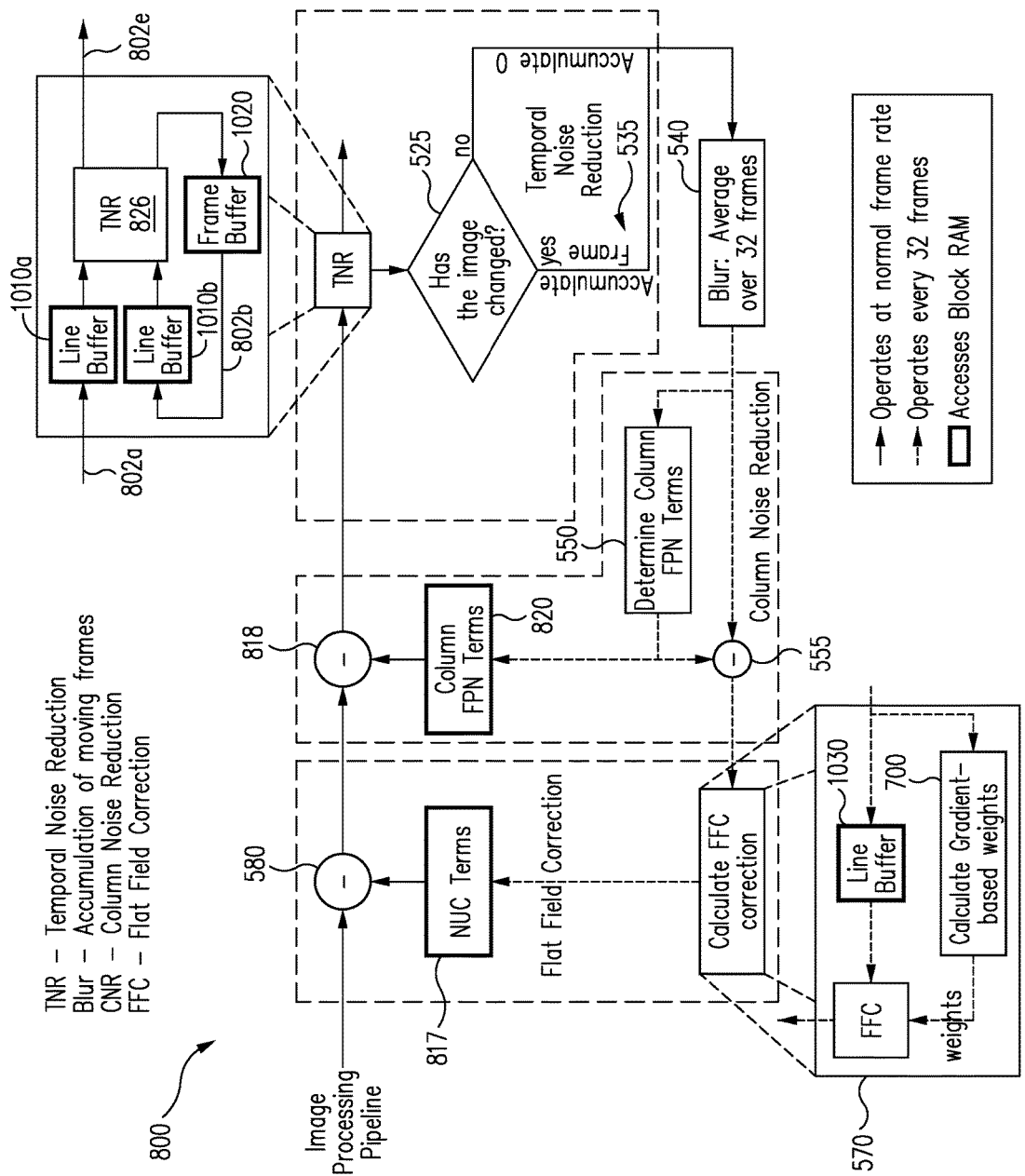
FIG. 10 illustrates particular implementation details of several processes of the image processing pipeline of FIG. 6 in accordance with an embodiment of the disclosure.

FIG. 10 illustrates further implementation details in relation to the TNR process of block 826. As shown in FIG. 10, image frames 802a and 802b may be read into line buffers 1010a and 1010b, respectively, and image frame 802b (e.g., the previous image frame) may be stored in a frame buffer 1020 before being read into line buffer 1010b. In one embodiment, line buffers 1010a-b and frame buffer 1020 may be implemented by a block of random access memory (RAM) provided by any appropriate component of infrared imaging module 100 and/or host device 102.

Referring again to FIG. 8, image frame 802e may be passed to an automatic gain compensation block 828 for further processing to provide a result image frame 830 that may be used by host device 102 as desired.

FIG. 8 further illustrates various operations that may be performed to determine row and column FPN terms and NUC terms as discussed. In one embodiment, these operations may use image frames 802e as shown in FIG. 8. Because image frames 802e have already been temporally filtered, at least some temporal noise may be removed and thus will not inadvertently affect the determination of row and column FPN terms 824 and 820 and NUC terms 817. In another embodiment, non-temporally filtered image frames 802 may be used.

In FIG. 8, blocks 510, 515, and 520 of FIG. 5 are collectively represented together. As discussed, a NUC process may be selectively initiated and performed in response to various NUC process initiating events and based on various criteria or conditions. As also discussed, the NUC process may be performed in accordance with a motion-based approach (blocks 525, 535, and 540) or a defocus-based approach (block 530) to provide a blurred image frame (block 545). FIG. 8 further illustrates various additional blocks 550, 552, 555, 560, 565, 570, 571, 572, 573, and 575 previously discussed with regard to FIG. 5.

As shown in FIG. 8, row and column FPN terms 824 and 820 and NUC terms 817 may be determined and applied in an iterative fashion such that updated terms are determined using image frames 802 to which previous terms have already been applied. As a result, the overall process of FIG. 8 may repeatedly update and apply such terms to continuously reduce the noise in image frames 830 to be used by host device 102.

Referring again to FIG. 10, further implementation details are illustrated for various blocks of FIGS. 5 and 8 in relation to pipeline 800. For example, blocks 525, 535, and 540 are shown as operating at the normal frame rate of image frames 802 received by pipeline 800. In the embodiment shown in FIG. 10, the determination made in block 525 is represented as a decision diamond used to determine whether a given image frame 802 has sufficiently changed such that it may be considered an image frame that will enhance the blur if added to other image frames and is therefore accumulated (block 535 is represented by an arrow in this embodiment) and averaged (block 540).

Also in FIG. 10, the determination of column FPN terms 820 (block 550) is shown as operating at an update rate that in this example is $1/32$ of the sensor frame rate (e.g., normal frame rate) due to the averaging performed in block 540. Other update rates may be used in other embodiments. Although only column FPN terms 820 are identified in FIG. 10, row FPN terms 824 may be implemented in a similar fashion at the reduced frame rate.

FIG. 10 also illustrates further implementation details in relation to the NUC determination process of block 570. In this regard, the blurred image frame may be read to a line buffer 1030 (e.g., implemented by a block of RAM provided by any appropriate component of infrared imaging module 100 and/or host device 102). The flat field correction technique 700 of FIG. 7 may be performed on the blurred image frame.

In view of the present disclosure, it will be appreciated that techniques described herein may be used to remove various types of FPN (e.g., including very high amplitude FPN) such as spatially correlated row and column FPN and spatially uncorrelated FPN.

Other embodiments are also contemplated. For example, in one embodiment, the rate at which row and column FPN terms and/or NUC terms are updated can be inversely proportional to the estimated amount of blur in the blurred image frame and/or inversely proportional to the magnitude of local contrast values (e.g., determined in block 560).

In various embodiments, the described techniques may provide advantages over conventional shutter-based noise correction techniques. For example, by using a shutterless process, a shutter (e.g., such as shutter 105) need not be provided, thus permitting reductions in size, weight, cost, and mechanical complexity. Power and maximum voltage supplied to, or generated by, infrared imaging module 100 may also be reduced if a shutter does not need to be mechanically operated. Reliability will be improved by removing the shutter as a potential point of failure. A shutterless process also eliminates potential image interruption caused by the temporary blockage of the imaged scene by a shutter.

Also, by correcting for noise using intentionally blurred image frames captured from a real world scene (not a uniform scene provided by a shutter), noise correction may be performed on image frames that have irradiance levels similar to those of the actual scene desired to be imaged. This can improve the accuracy and effectiveness of noise correction terms determined in accordance with the various described techniques.

As discussed, in various embodiments, infrared imaging module 100 may be configured to operate at low voltage levels. In particular, infrared imaging module 100 may be implemented with circuitry configured to operate at low power and/or in accordance with other parameters that permit infrared imaging module 100 to be conveniently and effectively implemented in various types of host devices 102, such as mobile devices and other devices.

Figure 12:
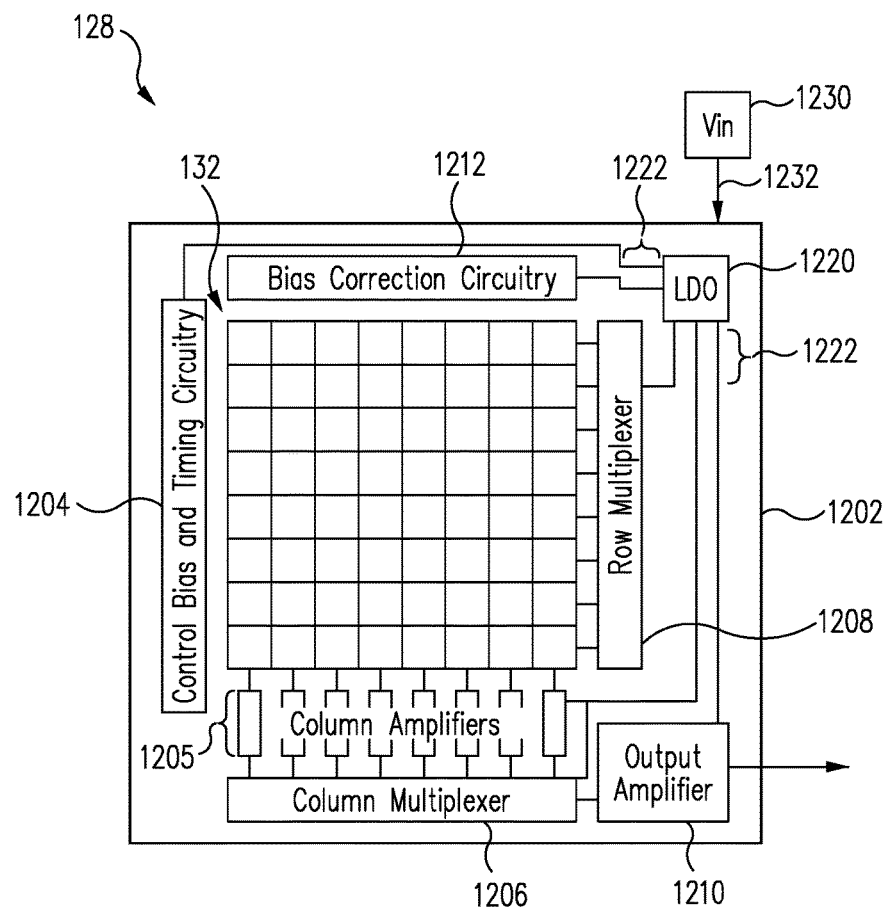
FIG. 12 illustrates a block diagram of another implementation of an infrared sensor assembly including an array of infrared sensors and a low-dropout regulator in accordance with an embodiment of the disclosure.

For example, FIG. 12 illustrates a block diagram of another implementation of infrared sensor assembly 128 including infrared sensors 132 and an LDO 1220 in accordance with an embodiment of the disclosure. As shown, FIG. 12 also illustrates various components 1202, 1204, 1205, 1206, 1208, and 1210 which may implemented in the same or similar manner as corresponding components previously described with regard to FIG. 4. FIG. 12 also illustrates bias correction circuitry 1212 which may be used to adjust one or more bias voltages provided to infrared sensors 132 (e.g., to compensate for temperature changes, self-heating, and/or other factors).

In some embodiments, LDO 1220 may be provided as part of infrared sensor assembly 128 (e.g., on the same chip and/or wafer level package as the ROIC). For example, LDO 1220 may be provided as part of an FPA with infrared sensor assembly 128. As discussed, such implementations may reduce power supply noise introduced to infrared sensor assembly 128 and thus provide an improved PSRR. In addition, by implementing the LDO with the ROIC, less die area may be consumed and fewer discrete die (or chips) are needed.

LDO 1220 receives an input voltage provided by a power source 1230 over a supply line 1232. LDO 1220 provides an output voltage to various components of infrared sensor assembly 128 over supply lines 1222. In this regard, LDO 1220 may provide substantially identical regulated output voltages to various components of infrared sensor assembly 128 in response to a single input voltage received from power source 1230.

For example, in some embodiments, power source 1230 may provide an input voltage in a range of approximately 2.8 volts to approximately 11 volts (e.g., approximately 2.8 volts in one embodiment), and LDO 1220 may provide an output voltage in a range of approximately 1.5 volts to approximately 2.8 volts (e.g., approximately 2.5 volts in one embodiment). In this regard, LDO 1220 may be used to provide a consistent regulated output voltage, regardless of whether power source 1230 is implemented with a conventional voltage range of approximately 9 volts to approximately 11 volts, or a low voltage such as approximately 2.8 volts. As such, although various voltage ranges are provided for the input and output voltages, it is contemplated that the output voltage of LDO 1220 will remain fixed despite changes in the input voltage.

The implementation of LDO 1220 as part of infrared sensor assembly 128 provides various advantages over conventional power implementations for FPAs. For example, conventional FPAs typically rely on multiple power sources, each of which may be provided separately to the FPA, and separately distributed to the various components of the FPA. By regulating a single power source 1230 by LDO 1220, appropriate voltages may be separately provided (e.g., to reduce possible noise) to all components of infrared sensor assembly 128 with reduced complexity. The use of LDO 1220 also allows infrared sensor assembly 128 to operate in a consistent manner, even if the input voltage from power source 1230 changes (e.g., if the input voltage increases or decreases as a result of charging or discharging a battery or other type of device used for power source 1230).

The various components of infrared sensor assembly 128 shown in FIG. 12 may also be implemented to operate at lower voltages than conventional devices. For example, as discussed, LDO 1220 may be implemented to provide a low voltage (e.g., approximately 2.5 volts). This contrasts with the multiple higher voltages typically used to power conventional FPAs, such as: approximately 3.3 volts to approximately 5 volts used to power digital circuitry; approximately 3.3 volts used to power analog circuitry; and approximately 9 volts to approximately 11 volts used to power loads. Also, in some embodiments, the use of LDO 1220 may reduce or eliminate the need for a separate negative reference voltage to be provided to infrared sensor assembly 128.

Figure 13:
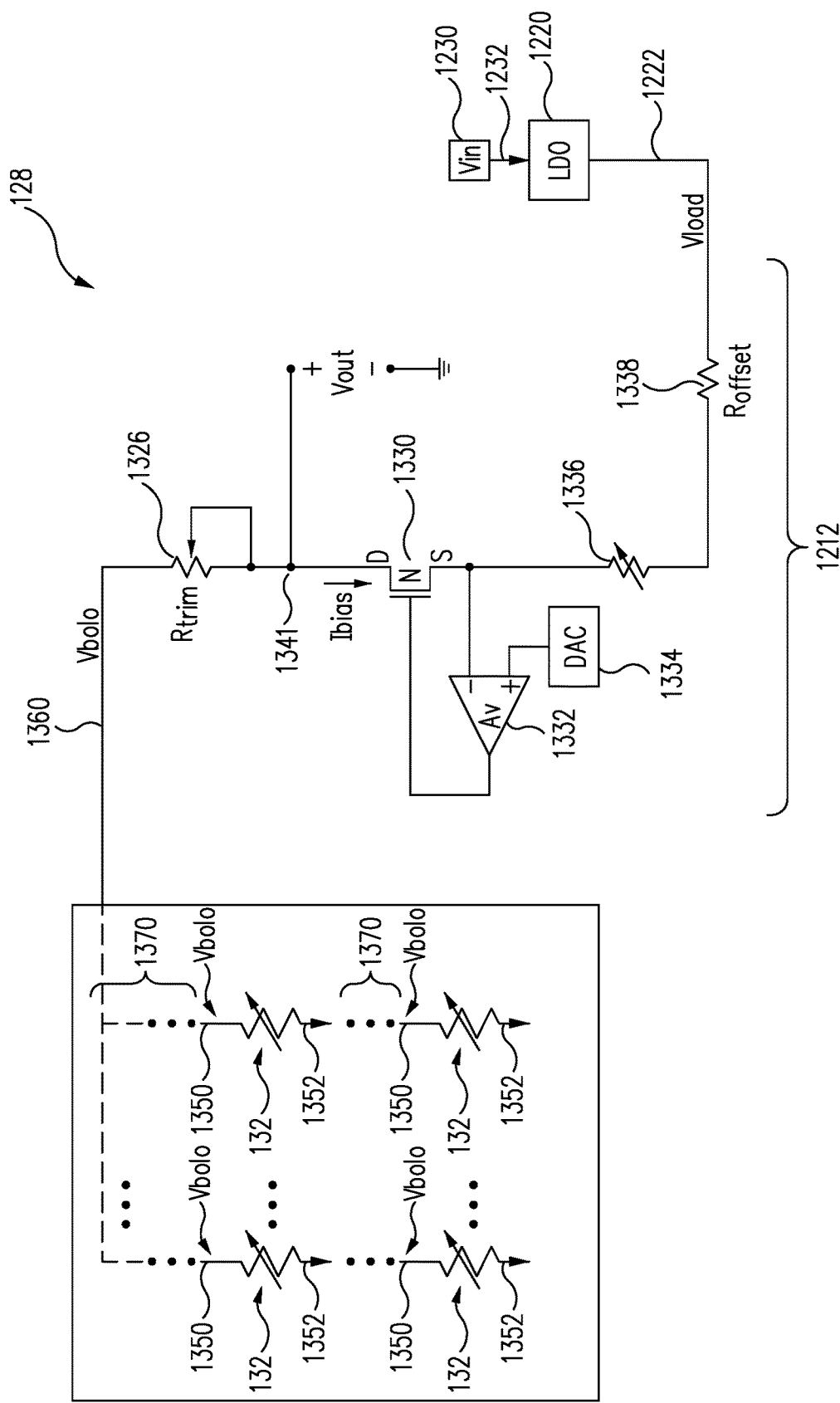
FIG. 13 illustrates a circuit diagram of a portion of the infrared sensor assembly of FIG. 12 in accordance with an embodiment of the disclosure.

Additional aspects of the low voltage operation of infrared sensor assembly 128 may be further understood with reference to FIG. 13. FIG. 13 illustrates a circuit diagram of a portion of infrared sensor assembly 128 of FIG. 12 in accordance with an embodiment of the disclosure. In particular, FIG. 13 illustrates additional components of bias correction circuitry 1212 (e.g., components 1326, 1330, 1332, 1334, 1336, 1338, and 1341) connected to LDO 1220 and infrared sensors 132. For example, bias correction circuitry 1212 may be used to compensate for temperature-dependent changes in bias voltages in accordance with an embodiment of the present disclosure. The operation of such additional components may be further understood with reference to similar components identified in U.S. Pat. No. 7,679,048 issued Mar. 16, 2010 which is hereby incorporated by reference in its entirety. Infrared sensor assembly 128 may also be implemented in accordance with the various components identified in U.S. Pat. No. 6,812,465 issued Nov. 2, 2004 which is hereby incorporated by reference in its entirety.

In various embodiments, some or all of the bias correction circuitry 1212 may be implemented on a global array basis as shown in FIG. 13 (e.g., used for all infrared sensors 132 collectively in an array). In other embodiments, some or all of the bias correction circuitry 1212 may be implemented an individual sensor basis (e.g., entirely or partially duplicated for each infrared sensor 132). In some embodiments, bias correction circuitry 1212 and other components of FIG. 13 may be implemented as part of ROIC 1202.

As shown in FIG. 13, LDO 1220 provides a load voltage Vload to bias correction circuitry 1212 along one of supply lines 1222. As discussed, in some embodiments, Vload may be approximately 2.5 volts which contrasts with larger voltages of approximately 9 volts to approximately 11 volts that may be used as load voltages in conventional infrared imaging devices.

Based on Vload, bias correction circuitry 1212 provides a sensor bias voltage Vbolo at a node 1360. Vbolo may be distributed to one or more infrared sensors 132 through appropriate switching circuitry 1370 (e.g., represented by broken lines in FIG. 13). In some examples, switching circuitry 1370 may be implemented in accordance with appropriate components identified in U.S. Pat. Nos. 6,812,465 and 7,679,048 previously referenced herein.

Each infrared sensor 132 includes a node 1350 which receives Vbolo through switching circuitry 1370, and another node 1352 which may be connected to ground, a substrate, and/or a negative reference voltage. In some embodiments, the voltage at node 1360 may be substantially the same as Vbolo provided at nodes 1350. In other embodiments, the voltage at node 1360 may be adjusted to compensate for possible voltage drops associated with switching circuitry 1370 and/or other factors.

Vbolo may be implemented with lower voltages than are typically used for conventional infrared sensor biasing. In one embodiment, Vbolo may be in a range of approximately 0.2 volts to approximately 0.7 volts. In another embodiment, Vbolo may be in a range of approximately 0.4 volts to approximately 0.6 volts. In another embodiment, Vbolo may be approximately 0.5 volts. In contrast, conventional infrared sensors typically use bias voltages of approximately 1 volt.

The use of a lower bias voltage for infrared sensors 132 in accordance with the present disclosure permits infrared sensor assembly 128 to exhibit significantly reduced power consumption in comparison with conventional infrared imaging devices. In particular, the power consumption of each infrared sensor 132 is reduced by the square of the bias voltage. As a result, a reduction from, for example, 1.0 volt to 0.5 volts provides a significant reduction in power, especially when applied to many infrared sensors 132 in an infrared sensor array. This reduction in power may also result in reduced self-heating of infrared sensor assembly 128.

In accordance with additional embodiments of the present disclosure, various techniques are provided for reducing the effects of noise in image frames provided by infrared imaging devices operating at low voltages. In this regard, when infrared sensor assembly 128 is operated with low voltages as described, noise, self-heating, and/or other phenomena may, if uncorrected, become more pronounced in image frames provided by infrared sensor assembly 128.

For example, referring to FIG. 13, when LDO 1220 maintains Vload at a low voltage in the manner described herein, Vbolo will also be maintained at its corresponding low voltage and the relative size of its output signals may be reduced. As a result, noise, self-heating, and/or other phenomena may have a greater effect on the smaller output signals read out from infrared sensors 132, resulting in variations (e.g., errors) in the output signals. If uncorrected, these variations may be exhibited as noise in the image frames. Moreover, although low voltage operation may reduce the overall amount of certain phenomena (e.g., self-heating), the smaller output signals may permit the remaining error sources (e.g., residual self-heating) to have a disproportionate effect on the output signals during low voltage operation.

To compensate for such phenomena, infrared sensor assembly 128, infrared imaging module 100, and/or host device 102 may be implemented with various array sizes, frame rates, and/or frame averaging techniques. For example, as discussed, a variety of different array sizes are contemplated for infrared sensors 132. In some embodiments, infrared sensors 132 may be implemented with array sizes ranging from 32 by 32 to 160 by 120 infrared sensors 132. Other example array sizes include 80 by 64, 80 by 60, 64 by 64, and 64 by 32. Any desired array size may be used.

Advantageously, when implemented with such relatively small array sizes, infrared sensor assembly 128 may provide image frames at relatively high frame rates without requiring significant changes to ROTC and related circuitry. For example, in some embodiments, frame rates may range from approximately 120 Hz to approximately 480 Hz.

In some embodiments, the array size and the frame rate may be scaled relative to each other (e.g., in an inversely proportional manner or otherwise) such that larger arrays are implemented with lower frame rates, and smaller arrays are implemented with higher frame rates. For example, in one embodiment, an array of 160 by 120 may provide a frame rate of approximately 120 Hz. In another embodiment, an array of 80 by 60 may provide a correspondingly higher frame rate of approximately 240 Hz. Other frame rates are also contemplated.

By scaling the array size and the frame rate relative to each other, the particular readout timing of rows and/or columns of the FPA may remain consistent, regardless of the actual FPA size or frame rate. In one embodiment, the readout timing may be approximately 63 microseconds per row or column.

As previously discussed with regard to FIG. 8, the image frames captured by infrared sensors 132 may be provided to a frame averager 804 that integrates multiple image frames to provide image frames 802 (e.g., processed image frames) with a lower frame rate (e.g., approximately 30 Hz, approximately 60 Hz, or other frame rates) and with an improved signal to noise ratio. In particular, by averaging the high frame rate image frames provided by a relatively small FPA, image noise attributable to low voltage operation may be effectively averaged out and/or substantially reduced in image frames 802. Accordingly, infrared sensor assembly 128 may be operated at relatively low voltages provided by LDO 1220 as discussed without experiencing additional noise and related side effects in the resulting image frames 802 after processing by frame averager 804.

Other embodiments are also contemplated. For example, although a single array of infrared sensors 132 is illustrated, it is contemplated that multiple such arrays may be used together to provide higher resolution image frames (e.g., a scene may be imaged across multiple such arrays). Such arrays may be provided in multiple infrared sensor assemblies 128 and/or provided in the same infrared sensor assembly 128. Each such array may be operated at low voltages as described, and also may be provided with associated ROIC circuitry such that each array may still be operated at a relatively high frame rate. The high frame rate image frames provided by such arrays may be averaged by shared or dedicated frame averagers 804 to reduce and/or eliminate noise associated with low voltage operation. As a result, high resolution infrared images may be obtained while still operating at low voltages.

In various embodiments, infrared sensor assembly 128 may be implemented with appropriate dimensions to permit infrared imaging module 100 to be used with a small form factor socket 104, such as a socket used for mobile devices. For example, in some embodiments, infrared sensor assembly 128 may be implemented with a chip size in a range of approximately 4.0 mm by approximately 4.0 mm to approximately 5.5 mm by approximately 5.5 mm (e.g., approximately 4.0 mm by approximately 5.5 mm in one example). Infrared sensor assembly 128 may be implemented with such sizes or other appropriate sizes to permit use with socket 104 implemented with various sizes such as: 8.5 mm by 8.5 mm, 8.5 mm by 5.9 mm, 6.0 mm by 6.0 mm, 5.5 mm by 5.5 mm, 4.5 mm by 4.5 mm, and/or other socket sizes such as, for example, those identified in Table 1 of U.S. Provisional Patent Application No. 61/495,873 previously referenced herein.

In various embodiments, infrared sensor assembly 128 may be implemented by an integrated circuit. Such an integrated circuit may be provided in a compact manner with a reduced number of layers and interconnections in comparison with conventional infrared imaging devices. In particular, a limited number of metal layers (e.g., no more than three in some embodiments) may be provided between active circuit components and infrared sensors 132 of infrared sensor assembly 128.

Figure 14:
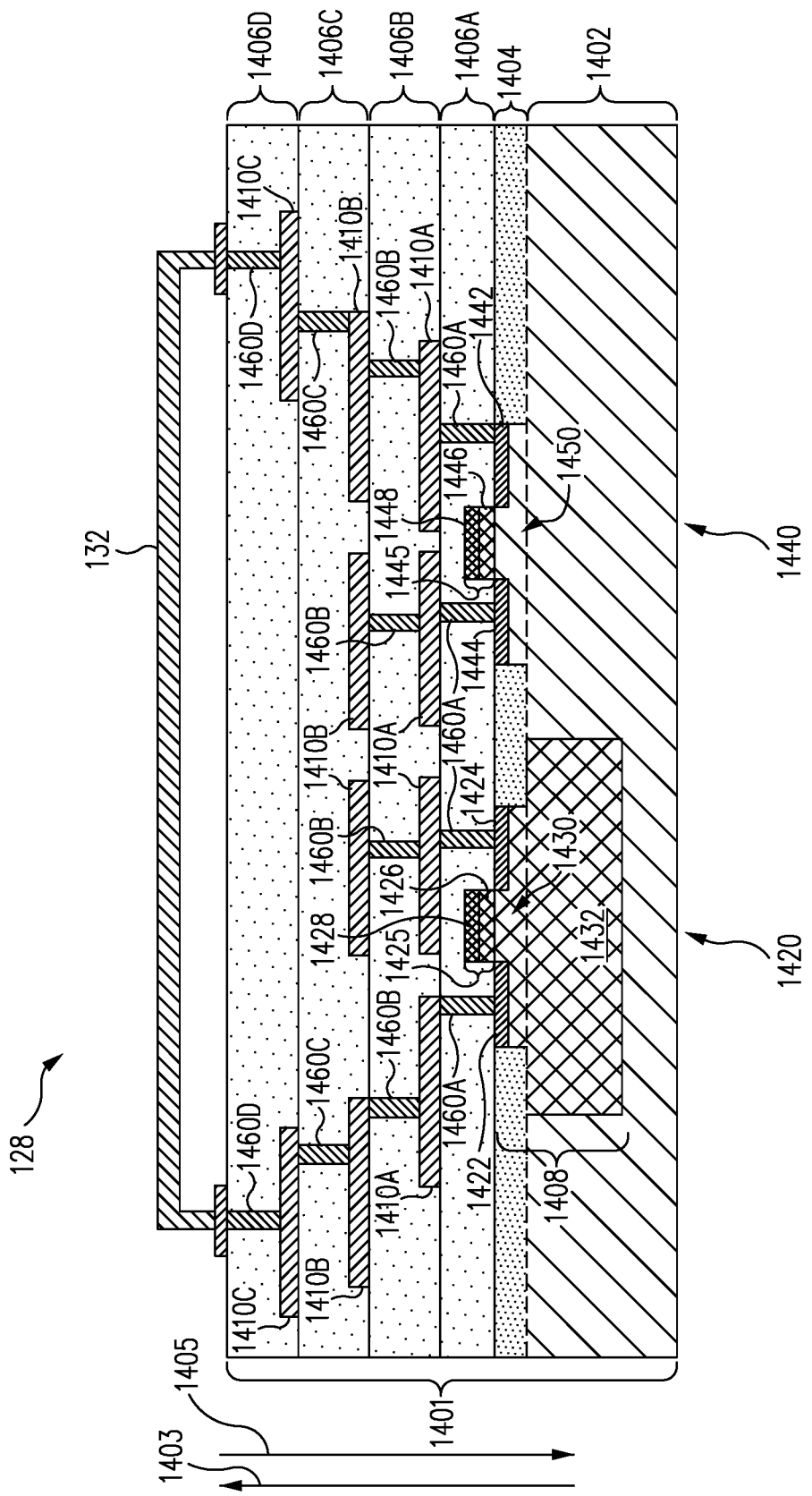
FIG. 14 illustrates a cross-sectional view of a portion of an infrared sensor assembly in accordance with an embodiment of the disclosure.

For example, FIG. 14 illustrates a cross-sectional view of a portion of infrared sensor assembly 128 in accordance with an embodiment of the disclosure. In particular, FIG. 14 illustrates a cross-sectional view of infrared sensor assembly 128 taken through a single infrared sensor 132 of an FPA and showing various integrated circuit layers underneath.

Infrared sensor assembly 128 may be implemented with infrared sensors 132 disposed on top of various layers 1401. Layers 1401 may be represented, for example, by substrate 140 of infrared sensor assembly 128 previously described herein. Layers 1401 include an epitaxial layer 1402, active circuit components 1408, insulating layers 1404 and 1406A-D, and metal layers 1410A-C. Vias 1460A-D, additional layers, and/or additional components may be provided within layers 1401 as appropriate.

As shown in FIG. 14, active circuit components 1408 may be provided on and/or in epitaxial layer 1402 (e.g., a silicon layer). In some embodiments, active circuit components 1408 may be any of the components of ROICs 402/1202 such as, for example, bias generation and timing control circuitry 404/1204, column amplifiers 405/1205, column multiplexers 406/1206, row multiplexers 408/1208, output amplifiers 410/1210, bias correction circuitry 1212, LDO 1220, switching circuitry 1370, and/or various components as appropriate.

In FIG. 14, active circuit components 1408 are represented by metal-oxide-semiconductor field-effect transistors (MOSFETs) 1420 and 1440 which are provided only for purposes of example. In this regard, active circuit components 1408 may include many additional and/or other types of circuit components (e.g., distributed under other infrared sensors 132 and/or elsewhere in ROICs 402/1202 and/or other portions of infrared sensor assembly 128). For example, in some embodiments, many active circuit components 1408 may be provided substantially in a single tier of components (e.g., shown in FIG. 14) which may be across infrared sensor assembly 128.

Transistor 1420 is implemented as a PMOS transistor including source/drain regions 1422 and 1424, a gate 1425 (e.g., including an oxide layer 1426 and a polysilicon layer 1428), a channel region 1430, and an N-well 1432. Transistor 1440 is implemented as an NMOS transistor including source/drain regions 1442 and 1444, a gate 1445 (e.g., including an oxide layer 1446 and a polysilicon layer 1448), and a channel region 1450. Other implementations of active circuit components 1408 are also contemplated.

Insulating layer 1404 is provided on epitaxial layer 1402 and may be implemented, for example, as a silicon layer or a silicon dioxide layer. Active circuit components 1408 may be provided on and/or in insulating layer 1404.

Additional insulating layers 1406A-D are provided above insulating layer 1404 and may be implemented, for example, as silicon layers and/or silicon dioxide layers. As shown, active circuit components 1408 may be provided on and/or in insulating layer 1406A.

Metal layers 1410A-C are disposed between the various insulating layers 1406A-D. For example, in some embodiments, metal layer 1410A may be disposed between insulating layers 1406A and 1406B, metal layer 1410B may be disposed between insulating layers 1406B and 1406C, and metal layer 1410C may be disposed between insulating layers 1406C and 1406D.

Infrared sensors 132 are disposed on top of insulating layer 1406D. Active circuit components 1408, metal layer 1410A, metal layer 1410B, metal layer 1410C, and infrared sensors 132 are separated by corresponding ones of insulating layers 1406A-D, and are interconnected by various vias 1460A-D (e.g., metal connections) passing through insulating layers 14606A-D.

For example, a set of vias 1460A connect metal layer 1410A with active circuit components 1408, a set of vias 1460B connect metal layer 1410B with metal layer 1410A, a set of vias 14600 connect metal layer 1410C with metal layer 1410B, and a set of vias 1460D connect infrared sensor 132 with metal layer 1410C. Although particular vias 1460A-D are shown, greater or fewer numbers of vias may be used. For example, although vias 1460A are illustrated as connecting metal layer 1410A to various source/drain regions 1422, 1424, 1442, and 1444 of active circuit components 1408, additional vias may be provided to connect gates 1425 and 1445 to metal layer 1410A (e.g., not present in the particular cross-section taken in FIG. 14).

Although vias 1460A-D are shown connecting adjacently stacked active circuit components 1408, metal layers 1410A-C, and infrared sensors 132, additional vias may be provided to interconnect various portions of infrared sensor assembly 128 together. For example, in some embodiments, other vias may be provided to directly connect any of active circuit components 1408, metal layers 1410A-C, and/or infrared sensors 132 together without requiring other intermediate connections by other metal layers 1410A-C or other vias 1460A-D.

Signals may be routed (e.g., passed) between active circuit components 1408 and infrared sensors 132 through various connections provided by metal layers 1410A-C and vias 1460A-D (e.g., up and down the various layers 1401 generally in the directions identified by arrows 1403 and 1405, respectively). Such signals (e.g., currents or voltages) may include, for example, bias signals (e.g., to bias infrared sensors 132 and/or various active circuit components 1408), signals corresponding to image frames captured by infrared sensors 132, and/or other signals.

In some embodiments, metal layer 1410A may be used to provide local connections between adjacent or nearby active circuit components 1408 to route signals therebetween. For example, as shown in FIG. 14, each of transistors 1420 and 1440 are connected to metal layer 1410A through vias 1460A. Metal layer 1410A may be implemented with appropriate signal paths (e.g., not present in the particular cross-section taken in FIG. 14) to connect together the various portions of metal layer 1410A residing above transistors 1420 and 1440.

In some embodiments, metal layer 1410B may be used to provide regional connections between various active circuit components 1408, such as blocks or groups of active circuit components 1408 that reside in different regions of infrared sensor assembly 128 (e.g., various active circuit components 1408 that are substantially horizontally disposed relative to each other substantially in a single tier). For example, metal layer 1410B may be connected to different portions of metal layer 1410A (e.g., through vias 1460B) at different areas of infrared sensor assembly 128. Signals may be routed from local active circuit components 1408 (e.g., transistors 1420 and/or 1440 in some embodiments) through vias 1460A up to metal layer 1410A, and through vias 1460B up to metal layer 1410B. Metal layer 1410B may route such signals to a remote region of infrared sensor assembly 128. In the remote region, the signals may be routed to remote active circuit components 1408 from metal layer 1410B through vias 1460E down to metal layer 1410A, and through vias 1460A down to the remote active circuit components 1408.

In some embodiments, metal layer 1410C may be used to provide regional connections between various active circuit components 1408, such as blocks or groups of active circuit components 1408 that reside in different regions of infrared sensor assembly 128 (e.g., various active circuit components 1408 that are substantially horizontally disposed relative to each other substantially in a single tier and/or vertically disposed relative to each other in multiple tiers). For example, metal layer 1410C may be connected to different portions of metal layer 1410B (e.g., through vias 14600) at different areas of infrared sensor assembly 128, and signals may be routed between metal layers 1410B and 1410C through vias 1460C.

In some embodiments, metal layer 1410C may be used to provide connections between infrared sensors 132 and other portions of infrared imaging module 128 (e.g., active circuit components 1408 and/or other portions). For example, infrared sensors 132 may be connected to different portions of metal layer 1410C (e.g., through vias 1460D) at different areas of infrared sensor assembly 128, and signals may be routed between infrared sensors 132 and metal layer 1410C through vias 1460D.

Thus, metal layers 1410A-C and vias 1460A-D provide a flexible and compact interconnected network of conductive paths to route various signals between any desired combination of active circuit components 1408, infrared sensors 132, and/or other portions of infrared sensor assembly 128.

As discussed, infrared imaging module 100 may be configured to operate at low voltage levels and may be implemented with circuitry configured to operate at low power and/or in accordance with other parameters that permit infrared imaging module 100 to be conveniently and effectively implemented in various types of host devices 102, such as mobile devices and other devices. Implementing infrared sensor assembly 128 as an FPA with a maximum of only three metal layers (e.g., metal layers 1410A, 1410B, and 1410C) between active circuit components 1408 and infrared sensors 132 provides these and various other advantages over conventional implementations.

For example, because signals may be passed between active circuit components 1408 and infrared sensors 132 through a maximum of three metal layers 1410A-C and associated vias 1460A-D, the overall length of circuit connections are reduced. In addition, by using a relatively small array of infrared sensors 132 running at low voltages, the effects of resistance exhibited by substantially horizontal connections (e.g., metal layers 1410A-C) may be reduced. In this regard, with a small array of infrared sensors 132 running at low voltages, the currents sent substantially horizontally (e.g., through metal layers 1410A-C) from the array to bond pads (e.g., bond pads 142) may be reduced. Due to this decrease in current, substantially horizontal signal paths may be implemented with larger resistances, and infrared sensor assembly 128 may be implemented with fewer numbers of metal layers (e.g., three metal layers 1410A-C). This contrasts with conventional implementations where large numbers of metal layers may be stacked on top of each other and used to route current horizontally in order to reduce horizontal resistances.

Moreover, implementing infrared sensor assembly 128 as an FPA with a maximum of only three metal layers between active circuit components 1408 and infrared sensors 132 reduces the complexity of infrared sensor assembly 128 which reduces manufacturing costs and improves manufacturing yields.

Infrared sensor assembly 128 may be manufactured in accordance with various techniques. Although layers 1401 of infrared sensor assembly 128 are described herein as being manufactured according to various processes, other processes may be used as appropriate.

Figure 15:
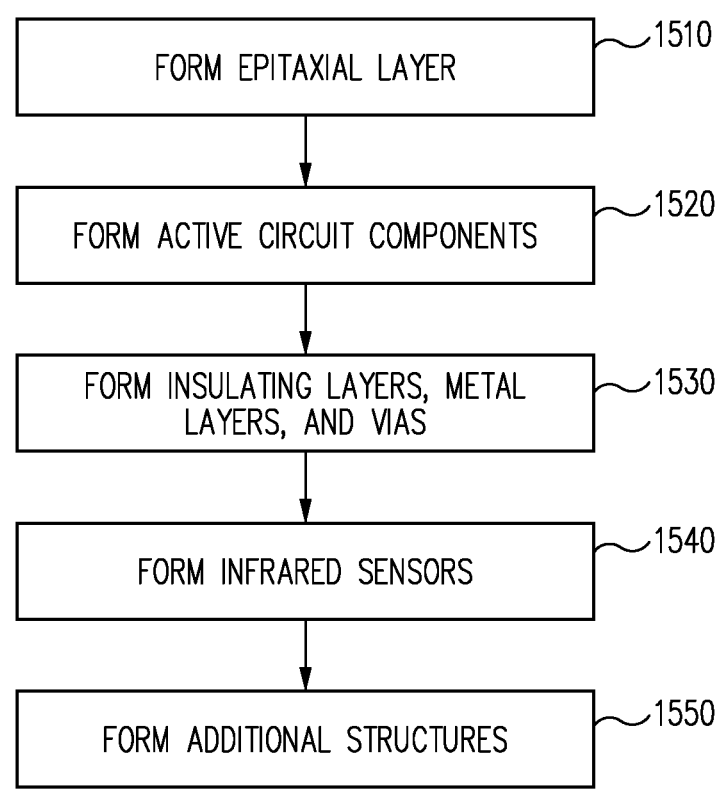
FIG. 15 illustrates a process of manufacturing an infrared sensor assembly in accordance with an embodiment of the disclosure.

FIG. 15 illustrates a process of manufacturing infrared sensor assembly 128 in accordance with an embodiment of the disclosure. In operation 1510, epitaxial layer 1402 is formed. In operation 1520, active circuit components 1408 are formed (e.g., formed on and/or in epitaxial layer 1402 and/or insulating layers 1404 and 1406A). For example, in various embodiments, one or more N-wells 1432 and/or P-wells may be formed in epitaxial layer, and various other structures (e.g., remaining portions of transistors 1420 and 1440) may be formed on top of epitaxial layer 1402. Although several example structures are shown in FIG. 14, any integrated circuit components may be formed as desired. In some embodiments, insulating layers 1404 and/or 1406A may be formed as part of operation 1520.

In operation 1530, insulating layers 1406A-D, metal layers 1410A-C, and vias 1460A-D are formed. In some embodiments, insulating layer 1404 may also be formed as part of operation 1530. In some embodiments, operation 1530 may be implemented as an iterative process as the various metal layers 1410A-C and their associated insulating layers 1406A-D and vias 1460A-D are formed. For example, after insulating layer 1406A, vias 1460A, and metal layer 1410A are formed, remaining sets of layers may be formed above them in an iterative process. Thereafter, in operation 1540, infrared sensors 132 are formed on top of insulating layer 1406D. In operation 1550, additional structures (not shown in FIG. 14) may be formed as may be desired for particular implementations of infrared sensor assembly 128.

Although particular structures of infrared sensor assembly 128 have been described with regard to FIGS. 14 and 15, other implementations are contemplated. For example, additional layers may be provided above, below, and/or between the various layers 1401 illustrated in FIG. 14 as may be desired in various implementations.

Although three metal layers 1410A-C have been described, the principles of the present disclosure may be applied to other embodiments using different numbers of metal layers. For example, in some embodiments, infrared sensor assembly 128 may be implemented with one, two, three, four, five, six, or greater numbers of metal layers as may be desired for various implementations. Where applicable, various associated vias may also be provided in such implementations to interconnect one or more of such metal layers, active circuit components 1408, and/or infrared sensors 132.

Moreover, the particular circuitry illustrated in FIG. 14 is only provided for purposes of example. As such, various other types of circuit components (e.g., active or non-active) may be implemented in accordance with the present disclosure.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the invention. Accordingly, the scope of the invention is defined only by the following claims.

What is claimed is:

1. A system comprising:
a focal plane array (FPA) integrated circuit comprising:
an array of infrared sensors adapted to image a scene;
a plurality of active circuit components;
a first metal layer disposed above and connected to the circuit components;
a second metal layer disposed above the first metal layer and connected to the first metal layer;
a third metal layer disposed above the second metal layer and below the infrared sensors, wherein the third metal layer is connected to the second metal layer and the infrared sensors;
wherein the first, second, and third metal layers are the only metal layers of the FPA between the infrared sensors and the circuit components; and
wherein the first, second, and third metal layers are adapted to route signals between the circuit components and the infrared sensors.

2. The system of claim 1, wherein:
the circuit components comprise a read out integrated circuit (ROIC) comprising a plurality of column amplifiers, a column multiplexer, and a row multiplexer;
the signals correspond to image frames captured by the infrared sensors; and
the first, second, and third metal layers are adapted to route the signals from the infrared sensors to the ROIC.

3. The system of claim 1, wherein the circuit components comprise:
a bias circuit adapted to provide a bias voltage in response to a regulated voltage selected from a range of approximately 1.5 volts to approximately 2.8 volts; and
a low-dropout regulator (LDO) adapted to provide the regulated voltage to the bias circuit in response to an external supply voltage selected from a range of approximately 2.8 volts to approximately 11 volts, wherein the signals comprise the bias voltage routed from the bias circuit to the infrared sensors through the first, second, and third metal layers.

4. The system of claim 1, wherein:
the circuit components comprise MOSFET transistors;
the signals are first signals;
the second metal layer is adapted to route second signals between first and second ones of the circuit components; and
the third metal layer is adapted to route third signals between third and fourth ones of the circuit components.

5. The system of claim 1, wherein the FPA integrated circuit further comprises:
a plurality of insulating layers above the active circuit components and below the infrared sensors, wherein the circuit components, the first metal layer, the second metal layer, the third metal layer, and the infrared sensors are separated by corresponding ones of the insulating layers;
a first set of vias passing through a first one of the insulating layers to connect the first metal layer to the circuit components;
a second set of vias passing through a second one of the insulating layers to connect the second metal layer to the first metal layer;
a third set of vias passing through a third one of the insulating layers to connect the third metal layer to the second metal layer; and
a fourth set of vias passing through a fourth one of the insulating layers to connect the infrared sensors to the third metal layer.

6. The system of claim 1, wherein:
the infrared sensors are microbolometers;
a size of the array of infrared sensors is approximately 80 by 60; and
the system is an infrared imaging module adapted to be inserted into a socket having a size less than approximately 8.5 mm by 8.5 mm.

7. The system of claim 1, further comprising a processor adapted to process an intentionally blurred image frame, wherein the blurred image frame comprises blurred thermal image data associated with the scene and noise introduced by the system, wherein the processor is adapted to:
use the blurred image frame to determine a plurality of non-uniformity correction (NUC) terms to reduce at least a portion of the noise; and
apply the NUC terms to image frames captured by the infrared sensors.

8. A method comprising:
imaging a scene using a focal plane array (FPA) integrated circuit comprising:
an array of infrared sensors adapted to image the scene,
a plurality of active circuit components,
a first metal layer disposed above and connected to the circuit components,
a second metal layer disposed above the first metal layer and connected to the first metal layer,
a third metal layer disposed above the second metal layer and below the infrared sensors, wherein the third metal layer is connected to the second metal layer and the infrared sensors, and
wherein the first, second, and third metal layers are the only metal layers of the FPA between the infrared sensors and the circuit components; and
routing signals between the circuit components and the infrared sensors through the first, second, and third metal layers.

9. The method of claim 8, wherein:
the circuit components comprise a read out integrated circuit (ROIC) comprising a plurality of column amplifiers, a column multiplexer, and a row multiplexer;
the method further comprises capturing image frames using the infrared sensors;
the signals correspond to the image frames; and
the routing comprises routing the signals from the infrared sensors to the ROIC through the first, second, and third metal layers.

10. The method of claim 8, wherein:
the circuit components comprise a bias circuit and a low-dropout regulator (LDO);
the signals comprise a bias voltage;
the routing comprises routing the bias voltage from the bias circuit to the infrared sensors through the first, second, and third metal layers; and
the method further comprises:
generating the bias voltage using the bias circuit in response to a regulated voltage selected from a range of approximately 1.5 volts to approximately 2.8 volts, and
providing the regulated voltage from the LDO to the bias circuit in response to an external supply voltage selected from a range of approximately 2.8 volts to approximately 11 volts.

11. The method of claim 8, wherein:

the circuit components comprise MOSFET transistors;

the signals are first signals; and the method further comprises:

routing second signals between first and second ones of the circuit components using the second metal layer, and routing third signals between third and fourth ones of the circuit components using the third metal layer.

12. The method of claim 8, wherein the FPA further comprises:

a plurality of insulating layers above the active circuit components and below the infrared sensors, wherein the circuit components, the first metal layer, the second metal layer, the third metal layer, and the infrared sensors are separated by corresponding ones of the insulating layers;

a first set of vias passing through a first one of the insulating layers to connect the first metal layer to the circuit components;

a second set of vias passing through a second one of the insulating layers to connect the second metal layer to the first metal layer;

a third set of vias passing through a third one of the insulating layers to connect the third metal layer to the second metal layer; and a fourth set of vias passing through a fourth one of the insulating layers to connect the infrared sensors to the third metal layer.

13. The method of claim 8, wherein:

the infrared sensors are microbolometers;

a size of the array of infrared sensors is approximately 80 by 60; and the FPA is part of an infrared imaging module adapted to be inserted into a socket having a size less than approximately 8.5 mm by 8.5 mm.

14. The method of claim 8, further comprising:

receiving an intentionally blurred image frame, wherein the blurred image frame comprises blurred thermal image data associated with the scene and noise introduced by an infrared imaging system;

processing the blurred image frame to determine a plurality of non-uniformity correction (NUC) terms to reduce at least a portion of the noise; and applying the NUC terms to captured image frames.

15. A method of manufacturing a focal plane array (FPA) integrated circuit, the method comprising:

forming a plurality of active circuit components;

forming a plurality of insulating layers above the active circuit components;

forming first, second, and third metal layers above the active circuit components;

forming a plurality of infrared sensors above the metal layers and the insulating layers;

wherein the circuit components, the first metal layer, the second metal layer, the third metal layer, and the infrared sensors are separated by corresponding ones of the insulating layers;

wherein the first, second, and third metal layers are the only metal layers of the FPA between the infrared sensors and the circuit components; and wherein the first, second, and third metal layers are adapted to route signals between the circuit components and the infrared sensors.

16. The method of claim 15, wherein:

the forming a plurality of active circuit components comprises forming a read out integrated circuit (ROIC) comprising a plurality of column amplifiers, a column multiplexer, and a row multiplexer;

the signals correspond to image frames captured by the infrared sensors; and the first, second, and third metal layers are adapted to route the signals from the infrared sensors to the ROIC.

17. The method of claim 15, wherein:

the forming a plurality of active circuit components comprises:

forming a bias circuit adapted to provide a bias voltage in response to a regulated voltage selected from a range of approximately 1.5 volts to approximately 2.8 volts, and forming a low-dropout regulator (LDO) adapted to provide the regulated voltage to the bias circuit in response to an external supply voltage selected from a range of approximately 2.8 volts to approximately 11 volts;

the signals comprise the bias voltage routed from the bias circuit to the infrared sensors through the first, second, and third metal layers.

18. The method of claim 15, wherein the circuit components comprise MOSFET transistors.

19. The method of claim 15, further comprising:

forming a first set of vias passing through a first one of the insulating layers to connect the first metal layer to the circuit components;

forming a second set of vias passing through a second one of the insulating layers to connect the second metal layer to the first metal layer;

forming a third set of vias passing through a third one of the insulating layers to connect the third metal layer to the second metal layer; and forming a fourth set of vias passing through a fourth one of the insulating layers to connect the infrared sensors to the third metal layer.

20. The method of claim 15, wherein:

the infrared sensors are microbolometers;

a size of the array of infrared sensors is approximately 80 by 60; and the FPA is a part of an infrared imaging module adapted to be inserted into a socket having a size less than approximately 8.5 mm by 8.5 mm.

* * * * *